(12) United States Patent
Mattos et al.

(10) Patent No.: US 9,455,027 B1
(45) Date of Patent: Sep. 27, 2016

(54) POWER MANAGEMENT SYSTEM FOR HIGH TRAFFIC INTEGRATED CIRCUIT

(71) Applicant: Cypress Semiconductor Corporation, San Jose, CA (US)

(72) Inventors: Derwin W. Mattos, San Mateo, CA (US); Thinh Tran, Palo Alto, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/822,085

(22) Filed: Aug. 10, 2015

Related U.S. Application Data

(60) Provisional application No. 62/035,181, filed on Aug. 8, 2014.

(51) Int. Cl.
*G11C 11/419* (2006.01)

(52) U.S. Cl.
CPC ................... *G11C 11/419* (2013.01)

(58) Field of Classification Search
CPC ............................. G11C 5/147; G11C 11/419
USPC ................................................. 365/154, 226
See application file for complete search history.

(56) References Cited

U.S. PATENT DOCUMENTS

| | | | |
|---|---|---|---|
| 5,481,469 A | 1/1996 | Brasen et al. | |
| 6,252,384 B1 * | 6/2001 | Arai | G06F 1/28 323/282 |
| 7,482,964 B2 * | 1/2009 | Garlapati | H03M 1/002 341/155 |
| 7,650,549 B2 | 1/2010 | Branch et al. | |
| 7,948,243 B2 * | 5/2011 | De Jong | G01R 31/318558 324/537 |
| 7,973,594 B2 | 7/2011 | Amrutur et al. | |
| 8,381,144 B2 | 2/2013 | Jen et al. | |
| 8,832,512 B2 | 9/2014 | Czysz et al. | |
| 2004/0150928 A1 * | 8/2004 | Goodfellow | H02M 3/1584 361/90 |
| 2007/0035280 A1 * | 2/2007 | Fujiyama | H03K 17/22 323/212 |
| 2010/0019827 A1 * | 1/2010 | Tamura | H03K 19/003 327/403 |
| 2012/0188861 A1 * | 7/2012 | Lan | G06F 1/3203 369/44.27 |
| 2014/0010022 A1 * | 1/2014 | Kim | G11C 5/14 365/185.18 |
| 2014/0179305 A1 * | 6/2014 | Singh | H04W 4/005 455/426.1 |
| 2014/0372818 A1 | 12/2014 | Rajski et al. | |
| 2015/0036389 A1 * | 2/2015 | Freeman | H02M 1/10 363/16 |

FOREIGN PATENT DOCUMENTS

WO   2011031430 A2   3/2011

OTHER PUBLICATIONS

Cy Hay, "Testing Low Power Designs with Power-Aware Test", Synopsys, Inc., dated Apr. 2010; 5 pages.

* cited by examiner

*Primary Examiner* — Michael Tran

(57) ABSTRACT

An integrated circuit (IC) device can include a memory array section comprising a plurality of memory arrays that each include memory cells for storing data values; a data path section having switching circuits configured to enable data paths between the memory arrays and a plurality of input/outputs (I/Os) of the IC device; and a power fill control circuit configured to activate power-fill circuits in the IC device to perform non-mission mode operations that consume current, the amount of non-mission mode operations varying in response to mission mode circuit activity in the IC device; wherein mission mode circuit activity includes circuit activity resulting from a user input to the IC device.

20 Claims, 15 Drawing Sheets

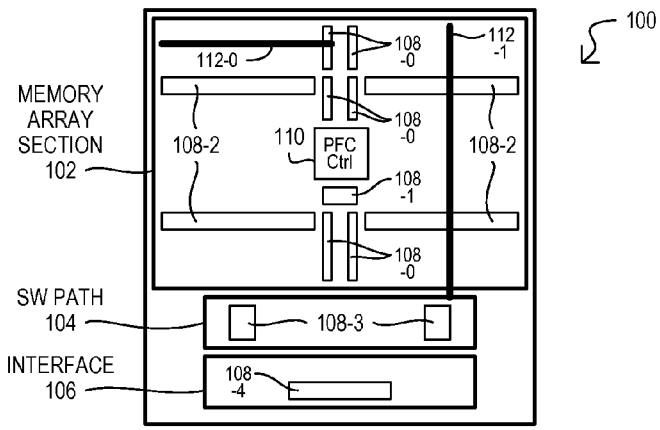
FIG. 1
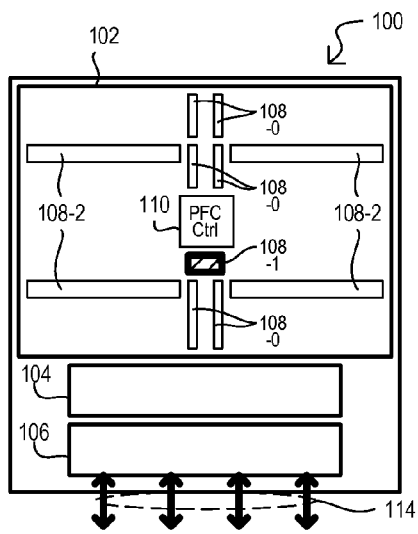
FIG. 2A (Hi Act.)
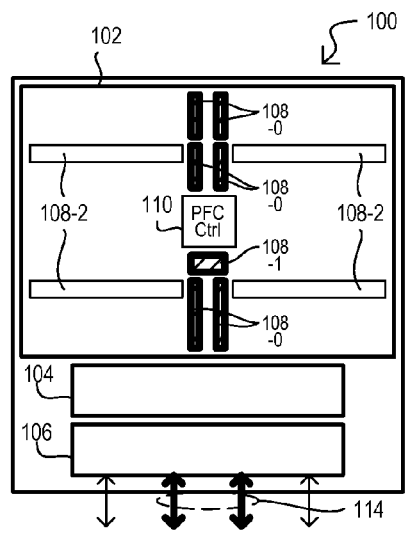
FIG. 2B (Med. Act.)
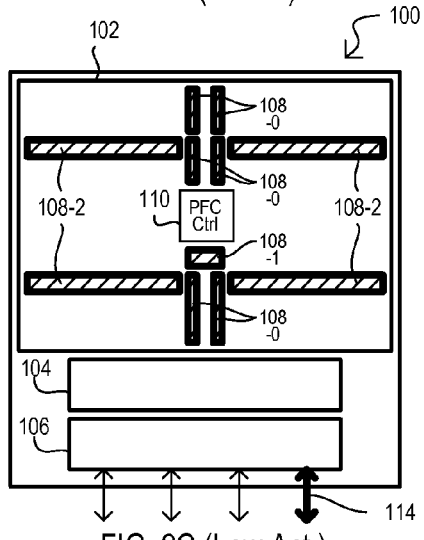
FIG. 2C (Low Act.)
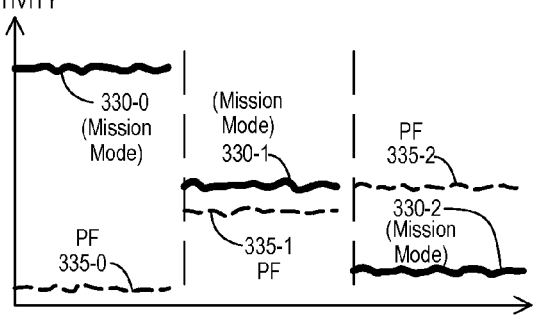
FIG. 3

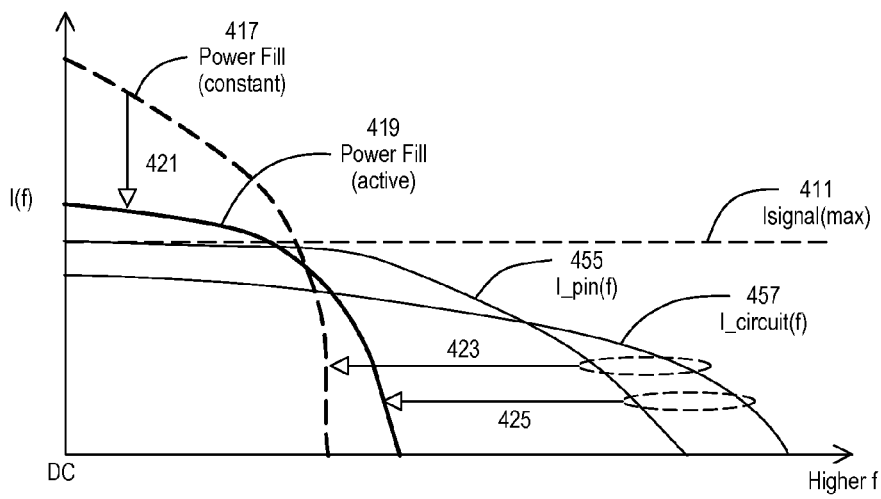
FIG. 4
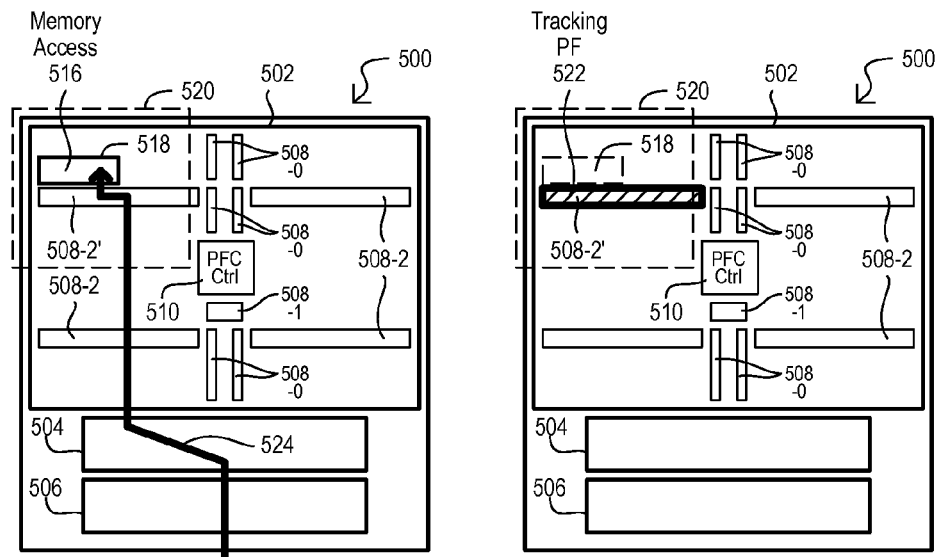
FIG. 5A
FIG. 5B
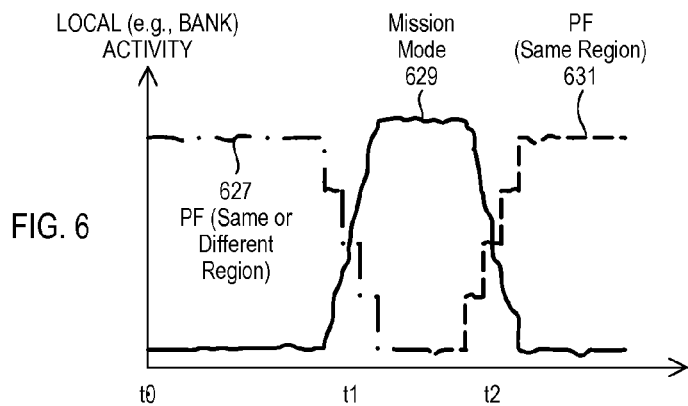
FIG. 6

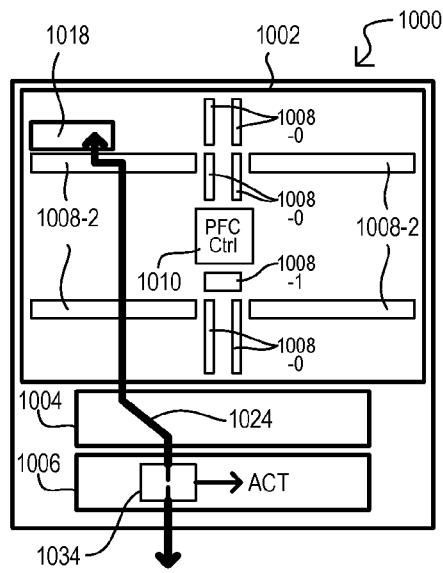
FIG. 10
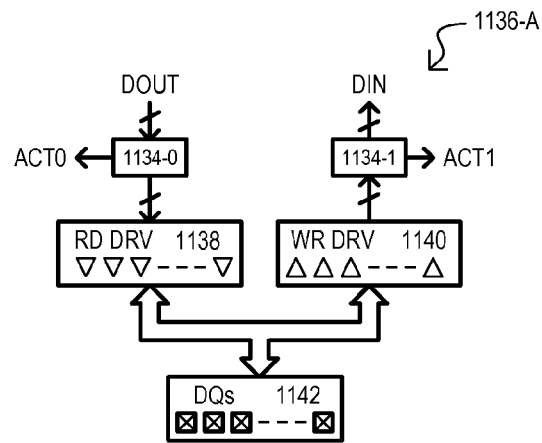
FIG. 11A
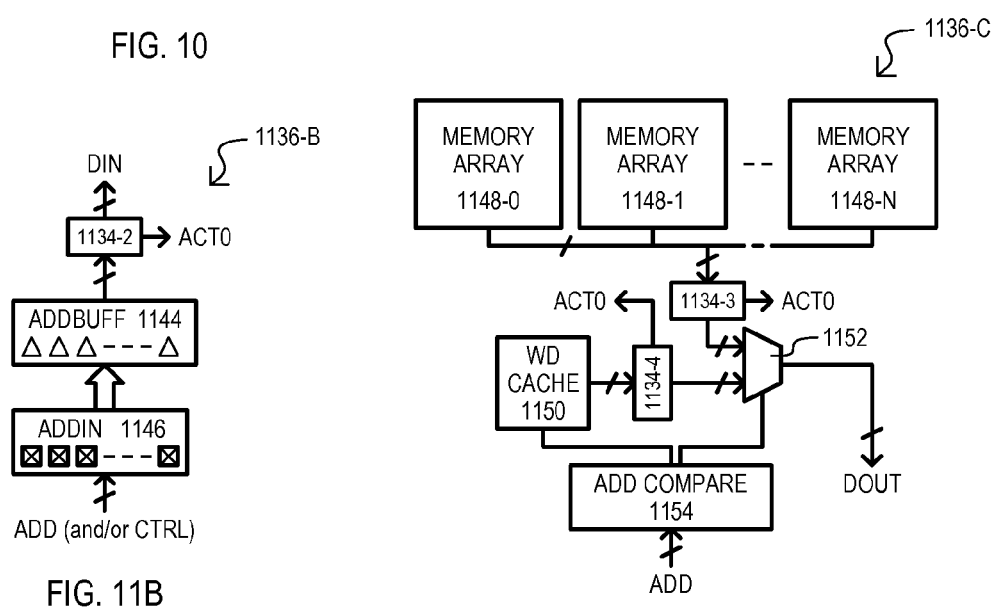
FIG. 11B
FIG. 11C
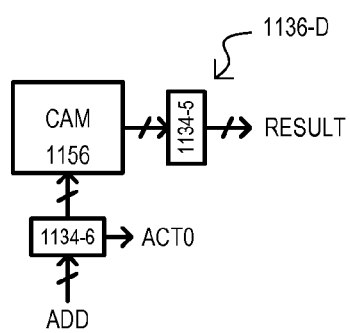
FIG. 11D

| # Channels Enabled | pFill Act. | Alternative A ||||| Alternative B ||| % pFill per bank |
|---|---|---|---|---|---|---|---|---|---|
| | | Number of bits toggled (%) |||| Bank Location | Number of bits toggled (%) | Bank Location | |
| | | 25 | 50 | 75 | 100 | | 100 | | |
| 1 | 0 | 0 | 0 | 0 | 0 | - | 0 | - | 0 |
| 2 | 0 | 0 | 0 | 0 | 0 | - | 0 | - | |
| 3 | 2 | 36 | 72 | 108 | 144 | +8 | 144 | 0,8,5,13 | 25 |
| 4 | 2 | 36 | 72 | 108 | 144 | +8 | 144 | 0,8,5,13 | |
| 5 | 4 | 72 | 144 | 216 | 288 | +5 | 288 | 2,10,3,11 | |
| 6 | 4 | 72 | 144 | 216 | 288 | +5 | 288 | 2,10,3,11 | |
| 7 | 6 | 108 | 216 | 324 | 432 | +13 | 432 | 4,12,1,9 | |
| 8 | 6 | 108 | 216 | 324 | 432 | +13 | 432 | 4,12,1,9 | |
| 9 | 8 | 144 | 288 | 432 | 576 | +2 | 576 | 6,14,7,15 | |
| 10 | 8 | 144 | 288 | 432 | 576 | +2 | 576 | 6,14,7,15 | |
| 11 | 10 | 180 | 360 | 540 | 720 | +10 | 720 | 0,8,5,13 | 50 |
| 12 | 10 | 180 | 360 | 540 | 720 | +10 | 720 | 0,8,5,13 | |
| 13 | 12 | 216 | 432 | 648 | 864 | +3 | 864 | 2,10,3,11 | |
| 14 | 12 | 216 | 432 | 648 | 864 | +3 | 864 | 2,10,3,11 | |
| 15 | 14 | 252 | 504 | 756 | 1008 | +11 | 1008 | 4,12,1,9 | |
| 16 | 14 | 252 | 504 | 756 | 1008 | +11 | 1008 | 4,12,1,9 | |
| 17 | 16 | 288 | 576 | 864 | 1152 | +4 | 1152 | 6,14,7,15 | |
| 18 | 16 | 288 | 576 | 864 | 1152 | +4 | 1152 | 6,14,7,15 | |
| 19 | 18 | 324 | 648 | 972 | 1296 | +12 | 1296 | 0,8,5,13 | 75 |
| 20 | 18 | 324 | 648 | 972 | 1296 | +12 | 1296 | 0,8,5,13 | |
| 21 | 20 | 360 | 720 | 1080 | 1440 | +1 | 1440 | 2,10,3,11 | |
| 22 | 20 | 360 | 720 | 1080 | 1440 | +1 | 1440 | 2,10,3,11 | |
| 23 | 22 | 396 | 792 | 1188 | 1584 | +9 | 1584 | 4,12,1,9 | |
| 24 | 22 | 396 | 792 | 1188 | 1584 | +9 | 1584 | 4,12,1,9 | |
| 25 | 24 | 432 | 864 | 972 | 1728 | +6 | 1728 | 6,14,7,15 | |
| 26 | 24 | 432 | 864 | 972 | 1728 | +6 | 1728 | 6,14,7,15 | |
| 27 | 26 | 468 | 936 | 1080 | 1872 | +14 | 1872 | 0,8,5,13 | 100 |
| 28 | 26 | 468 | 936 | 1080 | 1872 | +14 | 1872 | 0,8,5,13 | |
| 29 | 28 | 504 | 1008 | 1512 | 2016 | +7 | 2016 | 2,10,3,11 | |
| 30 | 28 | 504 | 1008 | 1512 | 2016 | +7 | 2016 | 2,10,3,11 | |
| 31 | 30 | 540 | 1080 | 1620 | 2160 | +15 | 2160 | 4,12,1,9 | |
| 32 | 30 | 540 | 1080 | 1620 | 2160 | +15 | 2160 | 4,12,1,9 | |

FIG. 16

| Bank Location | Time 0 State | | | Time 1 State | | |
|---|---|---|---|---|---|---|
| 0 | 0 | 0 | off | 0 | 0 | off |
| 1 | 0 | 0 | off | 0 | 0 | off |
| 2 | 1 | 0 | stale | 1 | 0 | stale |
| 3 | 0 | 0 | off | 0 | 0 | off |
| 4 | 0 | 0 | off | 0 | 0 | off |
| 5 | 1 | 1 | on | 1 | 0 | stale |
| 6 | 0 | 0 | off | 0 | 0 | off |
| 7 | 0 | 0 | off | 0 | 0 | off |
| 8 | 0 | 0 | off | 0 | 0 | off |
| 9 | 0 | 0 | off | 0 | 0 | off |
| 10 | 1 | 0 | stale | 0 | 0 | off |
| 11 | 0 | 0 | off | 0 | 0 | off |
| 12 | 0 | 0 | off | 1 | 1 | on |
| 13 | 1 | 0 | stale | 1 | 0 | stale |
| 14 | 0 | 0 | off | 0 | 0 | off |
| 15 | 0 | 0 | off | 0 | 0 | off |

POWER MANAGEMENT SYSTEM FOR HIGH TRAFFIC INTEGRATED CIRCUIT

This application claims the benefit of U.S. provisional patent application Ser. No. 62/035,181 filed on Aug. 8, 2014, the contents all of which are incorporated by reference herein.

TECHNICAL FIELD

The present disclosure relates generally to integrated circuit (IC) devices, and more particularly to regulating power supply current changes in high data traffic integrated circuits, including memory devices.

BACKGROUND

In order to increase performance of electronic systems, integrated circuits (ICs) are being designed to handle high amounts of data traffic (large numbers of input signals, such as data and/or address values). For example, memory devices can have "wide" input/output configurations (interfaces of greater than 256 data bits). More particularly, quad data rate type static random access memories (QDR SRAMs). Such high traffic devices can dissipate significant amounts of power. Such power consumption can result in undesirably large draws in power supply current, resulting in power supply voltage fluctuations. If such fluctuations are large enough, an IC can fail or suffer damage.

To mitigate these risks, the power needs of such ICs are controlled or maintained to be near static, resulting in high levels of wasted power dissipation when the device is not accessed. This effects product competitiveness, as it is also desirable to have the lowest possible power dissipation when portions of an IC are not in use.

Across the power spectrum of an IC device, various solutions can be applied to minimize voltage drops arising from resistance (IR) and inductance L(di/dt). DC power dissipation arises from on-die power grid wires, resulting in a static IR drop. To address this static IR drop, the power and ground grid (PG pins) can be constructed with a minimized resistance and the operating circuit can be made to draw less current.

For transient characteristics, where the voltage drop is determined by I(t)R+L(di/dt), current is drawn from the power supply and from local area pre-charged capacitance. The resistance from the circuit to both the power supply and the pre-charged capacitance can be minimized to limit the I(t)R component. Often though, the primary issue for transient responses can be the L(di/dt) component, as current passes through the inductive, external power connections to the device. To prevent high frequency current from passing through the PG pins, decoupling capacitors are used. Decoupling capacitors can act to bypass or "decouple" the external power supply connection from the circuit being served. They can translate high frequency circuit current draw to lower frequency current that passes through the external connections.

FIG. 24 is a graph showing a current draw I(f) of an IC versus frequency. Included is current draw arising at pins 2455 as well as that resulting from circuits 2457. FIG. 24 also shows an impedance of an IC power distribution network (Z_PDN(f)) versus frequency. A current draw of an IC can have very high frequency components yet the current through the PG pins reaches a lower maximum frequency.

Once the current passes through the PG pins, the external power delivery network (PDN) characteristic (2461) becomes dominant. An external PDN is typically designed to address low frequency current, where larger decoupling capacitors (2465) exist at the package and board levels to address high frequency current One way to ensure current draw does not adversely affect or damage a high traffic IC is to limit the number of active data paths. As but one particular example, in a wide I/O memory device with multiple independent channels, there can be limit to the number of channels allowed to access the memory arrays at the same time.

Power dissipation in a high data traffic IC can also be data pattern dependent. The more data states change, the more power is consumed. As but one very particular example, different data patterns for a QDR wide I/O SRAM are considered. These cases are estimates, and provided only to understand data pattern power dependence. In a first case, in a 32 channel read operation from memory for more than 10 cycles, where all data signals do not change state, a maximum power level under this condition is estimated to be about 9W. In contrast, in a second case, if the same device is undergoing 16 channel read operation from a data cache (cached write data) for more than 10 cycles, where all data signals are toggling, and a 16 channel WRITE to data cache, where all data signals are toggling, an estimated maximum power level can be about 15W.

The number of cycles it takes to transition from the first state to the second state can be 4 cycles. Using 4 cycles as the ramp time, the maximum di/dt in this ramp time is estimated to be roughly 1.2 to 1.3 A/ns, which cannot be supported by many conventional PDNs. Further, in this scenario, the result can potentially be a 6A change in current between the two states. If this cycle repeats at a rate near of 30-80 MHz (13-30 ns), a worst case power supply oscillation can result if the frequency coincides with the power delivery network's (PDN's) resonance frequency.

One way to reduce di/dt can be a return-to-common signaling for data lines. Such a solution can be costly in area required, however, as it requires two wires per signal and a control circuit to control the switching.

BRIEF DESCRIPTION OF THE DRAWINGS

FIG. 1 is a block diagram of an integrated circuit (IC) device according to an embodiment.

FIGS. 2A to 2C are a sequence of block diagrams showing an IC device having power fill levels that scale with device activity, according to an embodiment.

FIG. 3 is a graph showing operations like those of FIGS. 2A to 2C.

FIG. 4 is a graph showing how power fill and other power monitoring operations can reduce current draw in an IC device.

FIGS. 5A and 5B are block diagrams showing an IC device having power fill operations that follow locations of device activity, according to an embodiment.

FIG. 6 is a graph showing an operation like that of FIGS. 5A and 5B.

FIG. 10 is a block diagram of an IC device having activity monitor circuits for activating power fill circuits according to an embodiment.

FIGS. 11A to 11D are block schematic diagrams showing activity monitor circuits for activating power fill circuits that can be included in memory devices, according to embodiments.

FIG. 16 is a table showing initial power fill levels that can vary according to a number of channels enabled, for two particular embodiments.

DETAILED DESCRIPTION

Figure 7A:
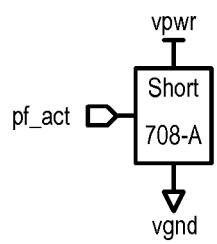
FIGS. 7A to 7C are diagrams showing "short" type side band power fill circuits that can be included in embodiments.

Embodiments can include integrated circuit (IC) devices with dynamic "power fill" circuits that execute dummy operations to maintain a certain amount of power consumption (power supply current draw), to reduce dynamic voltage drop, while at the same time controlling power dissipation levels. According to embodiments, the amount of power fill activating can increase and decrease based on the "mission mode" activity of the IC device. Mission mode activity can include circuit activity arising from the designed functions of the IC device. For example, functions resulting from a user input to the IC device. Mission mode activity is contrasted with dummy operations, which can be circuit activity not related to such IC device functions. An IC device can be a single die IC, or alternatively, an IC package including more than one die. In particular embodiments, an IC device can be a high data traffic IC.

According to some embodiments, power fill circuits can be dedicated circuits that do not provide any other function in the IC device and/or can be dual-mode circuits that have a mission mode function in one mode and a power fill function in another mode.

According to some embodiments, power fill circuits can follow the location of mission mode activity. Thus, if there is mission mode circuit activity in one region of the IC device, as such activity declines, power-fill circuits can be activated in the same region.

According to some embodiments, the activation of power fill circuits can be data pattern dependent. While data signals on the device are transitioning, power fill circuits can have low activity (or be inactive). As data signals stop transitioning, power fill circuits can increase activity.

Embodiments can minimize dynamic voltage drop, while at the same time ensuring sufficiently low power dissipation. Particular embodiments can control low-to-medium frequency i(t) through a power deliver network (PDN) of an IC device by adjusting power fill circuits according to activity level. Such a systematic power management can balance low power with high performance, particularly in a high data traffic IC device.

Various embodiments will now be described that an integrated circuit device with power circuits that can be dynamically activated to reduce power supply di/dt transitions. In some embodiments, an IC device can be a memory device. In particular embodiments, an IC device can be a static random access memory (SRAM) IC device having no less than 256 data input/outputs (I/Os).

In the various embodiments described below, like items are referred to the same reference characters but with the leading digit(s) corresponding to the figure number.

FIG. 1 is a block diagram of an IC device 100 according to an embodiment. IC device 100 can include various sections (102, 104, 106) as well as power fill circuits (108-0 to -4). Power fill circuits (108-0 to -4) can be activated in a dynamic fashion, in response to activity of the IC device.

In the embodiment shown, IC device 100 can also include a power fill control circuit 110. A power fill control circuit 110 can control the activation of some or all of the various power fill circuits (108-0 to -4). However, in alternate embodiments, some or all of the power fill circuits (108-0 to -4) can operate in an autonomous fashion, being activated in response to activity of the IC device.

Each section of the IC device (102, 104, 106) can provide a different mission mode function. In the embodiment shown, each section (102, 104, 106) can include one or more of its own power fill circuits.

In particular embodiments, an IC device 100 can be a memory device that includes a memory array section 102, a switch path section 104, and an interface section 106. A memory array section 102 can include multiple memory arrays with memory cells for storing data values. In a very particular embodiment, memory arrays can be SRAM cell arrays. According to some embodiments, some or all of the power fill circuits (108-0 to -2) within a memory array section 102 can be located in regions between memory arrays. As but two examples, power fill circuits 108-0/1 can be located in a vertical "spine" region, while power fill circuits 108-2 can be located in horizontal spine regions.

In some embodiments, an IC device 100 can include signal lines which can be driven by power fill circuits. In the particular embodiment shown, IC device 100 can include horizontal signal lines (one shown as 112-0) and/or vertical signal lines (one shown as 112-1) which can be driven by power fill circuits (i.e., serve as all or part of a load for power fill circuits). In particular embodiments, an IC device 100 can be a memory device, and either of signal lines 112-0/1 can be metallization lines having the same structure as global data lines that are connected local bit lines, where the local bit lines are connected to memory cells.

FIG. 1 also includes a power fill control circuit (PFC) 110. While power fill circuits can operate on their own (e.g., operate based on detected IC device activity), in some embodiments, any or all power fill circuits (108-0 to -4) can be controlled by a PFC circuit 110. In this way, power fill control circuit 110 can control the amount of total power fill activity on an IC device 100, increasing and decreasing such activity. In some embodiments, all or some of power fill circuits (108-0 to -4) can themselves operate at differing levels. In such an arrangement, by operation of PFC circuit 110, power fill levels can be increased and decreased not only by activation of particular power fill circuits (108-0 to -4), but also by altering the level of power consumption in particular power fill circuits (108-0 to -4).

FIGS. 2A to 2C show power fill operations for one particular embodiment of the IC device shown in FIG. 1. In FIGS. 2A to 2C, the amount of power fill activity can increase as the amount of mission mode circuit activity decreases, and vice versa. In FIGS. 2A to 2C, an IC device 100 can have a number of signal channels 114 for receiving and/or outputting data values. It is understood that data values can be any types of signal received/transmitted by IC device 100. In some embodiments, an IC device 100 can be a memory device, and signal channels 114 can include any of read data, write data, address values, or even control values. In particular embodiments, signal channels 114 can be data channels of a memory device, each having their own set of address and control inputs, as well as data I/Os.

FIG. 2A shows IC device 100 with high mission mode activity. For example, all signal channels 114 can be active and/or enabled. An active signal channel can be receiving of transmitting data values, while an enabled signal channel can be capable of transmitting/receiving data values. In such an arrangement, PFC circuit 110 can activate few, if any, power fill circuits, to keep power consumption levels down. In the particular embodiment shown, PFC circuit 110 can activate power fill circuit 108-1.

FIG. 2B shows IC device 100 with a medium amount of mission mode activity. For example, two of four signal channels 114 can be active and/or enabled. As a result, PFC circuit 110 can have activated a larger amount of fill circuits, to keep power consumption levels from changing too much. In the particular embodiment shown, PFC circuit 110 can additionally activate power fill circuits 108-0.

FIG. 2C shows IC device 100 with a low amount of mission mode activity. For example, all signal channels 114 can be disabled. As a result, PFC circuit 110 can have activated an even larger amount of fill circuits. In the particular embodiment shown, PFC circuit 110 can additionally activate power fill circuits 108-2.

It is understood that as IC device 100 can reduce power fill circuit activity as the mission mode activity increases.

While embodiments can scale power fill activity up and down in response to mission mode circuit activity, in addition or alternatively, such power fill scaling can be in response to switches between modes of operation. For example, when an IC device first powers up, there can be some minimum power fill circuit activity. If the device switches to a higher power consumption mode, power fill circuit activity can fall accordingly. Conversely, as the device switches to a lower power consumption mode, power fill circuit activity can rise accordingly. Still further, if the device is switching to a very low power (e.g., sleep) mode, power fill circuits can step down in a gradual fashion. When the device transitions out of the very low power mode, power fill circuits gradually ramp up to the minimum level.

FIG. 3 is a graph showing how power fill circuit activity can vary as mission mode activity varies. In time period P0, when mission mode circuit activity is high 333-0, power fill circuit activity can be low, or absent 335-0. In time period P1, when mission mode circuit activity is moderate 333-1, power fill circuit activity can be higher 335-1. In time period P2, when mission mode circuit activity is low 333-1, power fill circuit activity can be even higher 335-2.

Embodiments can include IC devices with a structural power fill mechanism to manage power. Control of the power fill mechanism can make power management possible. By including control of power fill circuits local to blocks or subsystems of the IC device, di/dt can be minimized in such blocks/subsystems. Accordingly, embodiments can include any of the following features: a toggling of targeted signals or circuits to mimic signal activity when there is no data mission-mode signal throughput; an enable control signal that can activate and deactivate power fill activity; and/or a level of power fill can be controlled through register settings. Accordingly, in particular embodiments, a PFC circuit can include a power fill setting register and/or have access to such a register.

Figure 24:
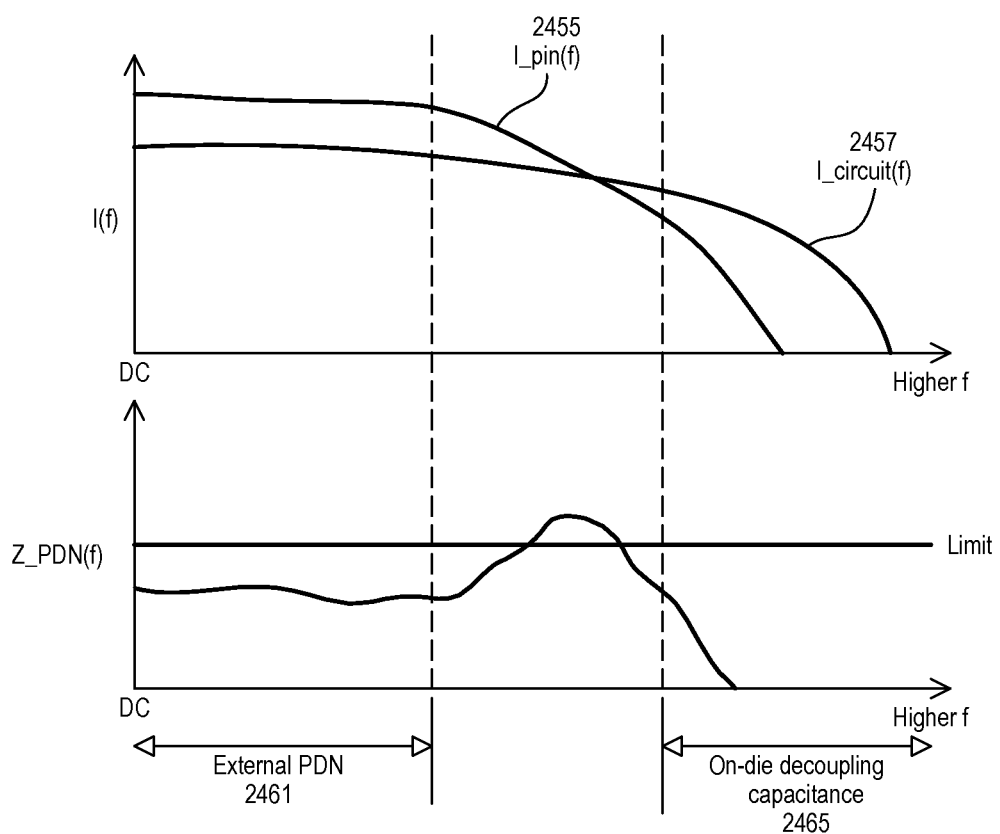
FIG. 24 is a graph showing current consumption and power delivery network impedance for a conventional SRAM device.

FIG. 4 is a graph showing how embodiments can utilize power fill to reduce current consumption, in particular large di/dt transitions. FIG. 4 includes the same current curves from FIG. 24 showing current consumption through power/ground (PG) pins 455 as well as by circuits 457 in the absence of any mitigating effects.

According to some embodiments, to reduce current draw through the PG pins at frequencies above DC, structural power fill can be employed, as described herein and equivalents. As noted above, structural power fill can include "dummy activity" when an IC device is not accessed (i.e., when real functional signals are not passing through the system). This can have the effect of removing or minimizing di/dt. However, if power fill is just constant, power consumption can scale up to an undesirably high level. This is represented in FIG. 4, by effect 423 pushing current curves to arrive at curve 417 (which represents pin current only).

To reduce steady-state power dissipation, embodiments can include scaling the power fill according to activity of the IC device. For example, scaling power fill according to number of channels activated by a static configuration register. Accordingly, a PFC circuit can access the register, and enable an appropriate number of power fill circuits. Scaling power fill can result in effect 421, which can push down the current curve and help arrive at curve 419 (which represents pin current only).

Embodiments can include further features to reduce di/dt. These can include controlling power consumption when switching between modes. For mode transitions in and out of reset, timing circuits can be gradually enabled. In particular embodiments, phase locked loop (PLL) and clock tree disable/enable can involve the PLL transitioning between low and high frequencies in a large time frame due to the natural start-up and shut-down characteristics of the PLL loop filter. The ramp-up and ramp-down of clock tree power can occur gradually due to the effect that the PLL operation has on the frequency of the clock output. Other mode transitions, whether driven by channel-enable changes or the entry/exit of standby, can be executed in incremental steps. Graduating power consumption through mode transitions can have the effect shown as 425.

A final outcome, implementing scaled power fill and gradual mode transitions can result in a response like that shown as 419 in FIG. 4.

FIGS. 5A and 5B are block diagrams of an IC device 500 according to another embodiment. FIGS. 5A/5B show an embodiment in which the location of power fill activity can track, or follow, that of mission mode activity. Thus, when a region of an IC device consumes power due to mission mode activity, as such activity subsides, power fill circuits in the same region can be activated to prevent a large di/dt drop in the particular regions.

In addition to corresponding items shown in FIG. 1, FIGS. 5A/5B further show an IC device region 520, as well as mission mode circuits 518 in the region.

FIG. 5A shows mission mode activity in the IC device 500. Mission mode circuit 518 within region 520 is active, consuming power. In one particular embodiment, an IC device 500 can be a memory device, and mission mode activity can be the accessing, via either a read or write operation, of data stored in a bank 518 located within a quadrant 520.

FIG. 5BA shows subsequent power fill activity in the IC device 500. Power fill circuits 508-2 within the same region 520 have been activated.

FIG. 6 is graph showing power tracking according to embodiments. At time t0, an IC device can have some power fill circuits active 627. At about time t1, in response to mission mode activity, the active power fill circuits can begin to power down, as mission mode circuits power up 629. At about time t2, in response to mission mode circuits powering down, power fill circuits in the same region can being to power up 631.

Power fill circuits can take various forms. In some embodiments, power fill circuits can be provided by toggling side-band circuitry instead of using mission-mode resources (circuits and wires). In such an embodiment, side-band activity (switching of power fill circuits) can have little if any effect on mission-mode performance (timing, cross-talk, etc.). In some embodiments, side band power fill circuits can be designed to provide low di/dt transitions. In addition or alternatively, such power fill circuits can operate at frequencies different from other signals of the IC device. For example, power fill circuits could switch in a medium frequency range. In a particular embodiment, an IC device can be a memory device operating at 750 MHz, while power-fill circuits can toggle at 375 MHz. Operating at medium frequencies can have little-to-no effect on any local decoupling capacitor voltages and/or may help to maintain a constant current at PG pins of the IC device.

In some embodiments, all or a portion of power fill circuits can provide a short circuit between the power and ground supplies, where a toggling signal, like a clock, would control the switch. Examples of such circuits are shown in FIGS. 7A to 7C.

Figure 7B:
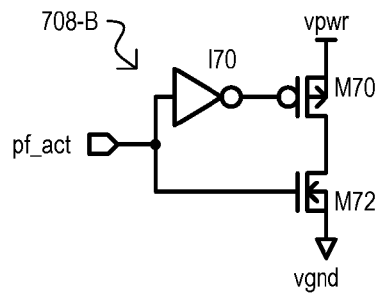
Figure 7C:
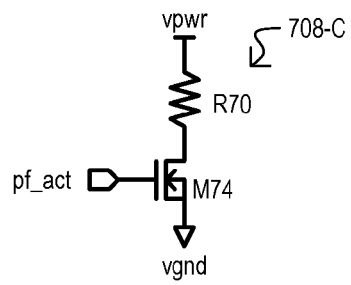

FIGS. 7A to 7C show "short circuit" type power fill circuits that can be included in embodiments. Referring to FIG. 7A, in response to a power fill activation signal pf_act, a power fill circuit 708-A can provide a current path between a first power supply voltage vpwr and a second, lower power supply voltage (i.e., ground).

FIG. 7B shows a power fill circuit 708-B that can be one implementation of that shown in FIG. 7A. Power fill circuit 708-B can include a p-channel MOS-type transistor M70 having a source-drain path in series with an n-channel MOS transistor M72. Inverter I70 can drive the gate of M70. In response to an active (high in this case) signal pf_act, both transistors M70/M72 can be turned on, creating a current path between vpwr and vgnd.

FIG. 7C shows a power fill circuit 708-C that can be another implementation of that shown in FIG. 7A. Power fill circuit 708-C can include a transistor (in this case an n-channel MOS-type transistor M74) having a source-drain path in series with a resistance R70. In response to an active (high in this case) signal pf_act, transistor M74 can be turned on, creating a current path between vpwr and vgnd. A resistance R70 can be any of: an explicit resistor formed for the power fill circuit, an inherent resistance present in an existing circuit structure, or a resistor used in both power fill and mission mode operations.

In some embodiments, all or a portion of power fill circuits can include circuits that drive a capacitive load. Such a capacitive load can be constructed of any suitable structures, including but not limited to logic gates, explicit device capacitors, or metal-oxide-metal capacitors (i.e., capacitors formed by metallization layers, but including any dielectric). If the capacitor is constructed using a replica data line, unnecessary cross-talk could be mitigated by any suitable method, including changes in switching speed and/or introducing a delay into the activation path. Examples of such circuits are shown in FIGS. 8A and 8B.

Figure 8A:
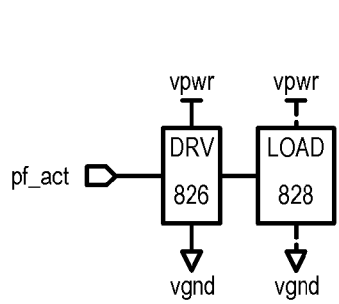
FIGS. 8A and 8B are diagrams showing load driving side band power fill circuits that can be included in embodiments.
Figure 8B:
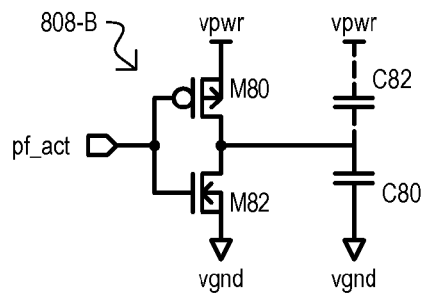

Referring to FIG. 8A, in response to a power fill activation signal pf_act, a driver circuit 826 can drive a capacitive load 828. FIG. 8B shows a power fill circuit 808-B that can be one implementation of that shown in FIG. 8A. Power fill circuit 808-B can include a CMOS type inverter formed by p-channel MOS-type transistor M80 and n-channel MOS transistor M82. A capacitive load can include a capacitance C80 between an output of inverter M80/M82 and a low power supply (e.g., ground). In addition or alternatively, a capacitive load can include a capacitance C82 between an output of inverter M80/M82 and a high power supply (e.g., vpwr).

In some embodiments, all or a portion of power fill circuits can include circuits that toggle mission mode circuits and wires. Such an option can be used where there is limited area and/or when a side-band circuit cannot provide a desired response (e.g., sufficiently replicate power levels of mission-mode activity). Using mission-mode circuits and wires can introduce unnecessary cross-talk into mission-mode signals, and so in some embodiments, power fill circuits that use mission mode circuits can introduce delay into the signal path (with respect to mission mode timing).

Figure 9:
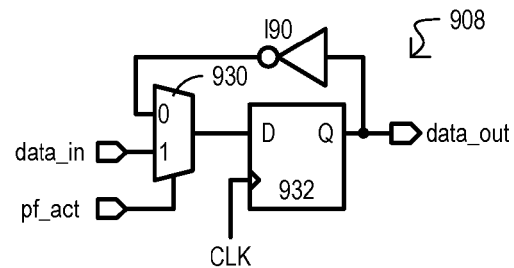
FIG. 9 is a block diagram of an in-line power fill circuit according to an embodiment.

FIG. 9 shows an "in line" power fill circuit 908 according to a particular embodiment. Power fill circuit 908 can include a flip-flop (FF) 932, an input multiplexer 930, and a feedback inverter I90. In a mission mode of operation, a power fill activation signal pf_act can be inactive (high in this example). A mission mode signal can be received at data_in and clocked out at data_out, according to clock signal CLK. In a power fill operation, signal pf_act can go low. Consequently, an inverted output signal provided by inverter I90 can be applied as an input to FF 932, and will then propagate through according to clock signal CLK, causing a transition at data_out.

It is understood that FIG. 9 shows but one very particular example of an in line power fill circuit.

According to some embodiments, power fill circuits can monitor mission mode signal paths, and be activated to draw current based on such signals. More particularly, while such signal paths are transitioning with mission mode data, power fill circuits can have no or little activity. However, as such signal paths stop switching with mission mode data, power fill circuits can be activated to increase current draw.

FIG. 10 shows an IC device 1000 having mission mode signal monitoring according to an embodiment. In addition to corresponding items shown in FIG. 1, FIG. 10 further show mission mode circuits 1018, and a signal path 1024 to such mission mode circuits. Further, IC device 1000 also includes a monitor circuit 1034. A monitor circuit 1034 can monitor activity on signal path 1024, and when activity on the signal path drops, can generate an activation signal ACT, which can activate power fill circuits. While FIG. 10 shows monitor circuit 1034 within circuit section 1006, such a monitor section can be situated at any suitable location along signal path 1024.

FIGS. 11A to 11D show possible monitor circuit locations according to embodiments. FIGS. 11A to 11D show monitor circuits that can be included in a memory device.

FIG. 11A show monitor circuits that can be included in a read/write data path 1136-A of memory device. In the embodiment shown, read data (DOUT) can be monitored by monitor circuit 1134-0 prior to being driven on IOs (DQs) 1142 by read data drivers 1138. In addition or alternatively, write data received at IOs 1142 can be monitored by monitor circuit 1134-1 after being driven by write drivers 1140. When monitored signal activity falls below a threshold, monitor circuits 1134-0/1 can generate an activation signal ACT which can activate power fill circuits. It is understood that in alternate embodiments, monitor circuits 1134-0/1 could be located at various other points in the read/write data paths.

FIG. 11B show monitor circuits that can be included in an address/control path 1136-B of memory device. In the embodiment shown, address (and/or control) signals can be monitored by monitor circuit 1134-2 after being received at address inputs 1146 and output by address buffer 1144. In alternate embodiments, monitor circuit 1134-2 could be located at various other points in the address/control path.

FIG. 11C show monitor circuits that can be included in a read data path 1136-C of memory device. A read data path 1136-1 can include an "uncached" data path from memory arrays (1148-0 to -N) to a read data MUX 1152. In addition, there can be a cached read data path. An address compare circuit 1154 can compare a received read address to cached write addresses to check for a "cache hit". If such a cache his exists, data from write cache 1150 can be output as read data to read MUX 1152. Read MUX 1152 can output read data based on a cache hit. In the embodiment shown, monitor circuit 1134-3 can monitor signal activity in the uncached read data path, while monitor circuit 1134-4 can monitor signal activity in the cached read data path.

FIG. 11D show monitor circuits that can be included in a content addressable memory (CAM) section 1136-C included within a larger memory device. A CAM section 1136-C can compare read addresses to cached write addresses. In the embodiment shown, monitor circuit 1134-6 can monitor address inputs to CAM 1156, while monitor circuit 1134-5 can monitor compare results provided by CAM 1156.

Figure 12A:
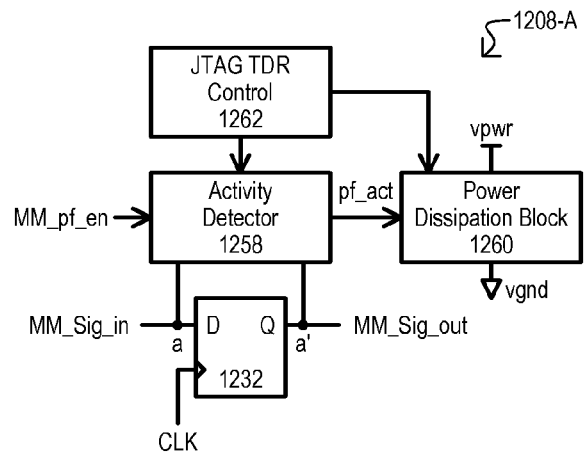
FIGS. 12A to 12C are diagrams showing an activity monitoring power fill circuits and operation according to embodiments.
Figure 12B:
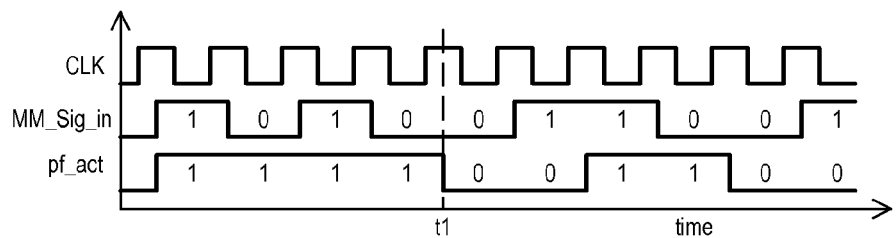

FIGS. 12A and 12B are diagrams showing a power fill circuit 1208-A can monitor mission mode signals and then dissipate power with a dissipation block. A dissipation block can be dedicated to power fill operations, or can be dual purpose (serve a mission mode function in other operations). Power-fill circuit 1208-A can include a FF 1232, an activity detector 1258, a power dissipation block 1260, and optionally, a test control block 1262.

Mission-mode signals (MM_Sign_in, MM_Sig_out) are monitored by an activity detector 1258. If switching activity of the monitored signal falls below a predetermined threshold, a power fill activation signal pf_act can be activated. In response to an active pf_act signal, a power dissipation block 1260 can consume power. Optionally, operations of activity detector 1258 and power dissipation block 1260 can be controlled through test control block 1262. Such control can include, but is not limited to, controlling a threshold of activity detector 1258 and a level of power dissipation provided by power dissipation block 1260. In particular embodiments, test control block can include JTAG type registers.

In the arrangement of FIG. 12A, a mission-mode signal (e.g., address, data control) can be monitored by a simple XOR gate which can control a toggling of a side-band, power-fill signal (pf_act). In some embodiments, a pf_act signal can toggle whenever a mission-mode signal does not.

FIG. 12B is a timing diagram showing an operation of a power fill circuit like that of FIG. 12A. In the example shown, a power fill activation signal (pf_act) is active when low. As shown, while a mission mode signal MM_Sig_in transitions, signal pf_act can remain inactive (high). However, as shown at time t1, when mission mode signal MM_Sig_in does not transition, signal pf_act can be activated (go low), thus enabling a power dissipation circuit.

Figure 12C:
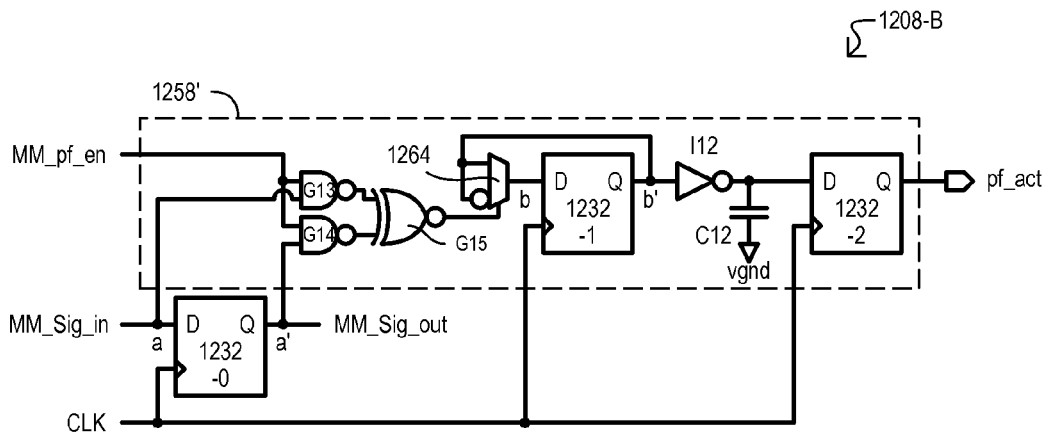

FIG. 12C is a block schematic diagram showing one very particular implementation of that shown in FIG. 11A. An activity detector 1258' can include a XOR circuit formed by gates G13, G14 and G15, an input MUX 1264, two FF 1232-1/2, and an inverter I12. XOR circuit is enabled by a signal MM_pf_en. FFs 1232-0/1 can be connected in series by inverter I12, with a load capacitance C12 connected at the input of FF 1232-1.

Accordingly, when signal MM_pf_en is active, and signals MM_Sig_in and MM_Sign_out are the same (indicating no transition in the mission mode signal), input MUX 1264 can apply the inverse of the signal output from FF 1232-1 to its input. This will cause FF 1232-1 to transition its output in the next clock cycle. This output can be inverted by inverter I12 and applied as an input to FF 1232-2. An output of FF 1232-2 can be a pf_act signal.

In contrast, when a transition is detected by XOR circuit, input MUX 1264 can apply the non-inverted output from FF 1232-1 to its input. This will cause transitions to stop at the output of FF 1232-1. Consequently, the pf_act signal will stop transitioning.

Figures 13A, 13B:
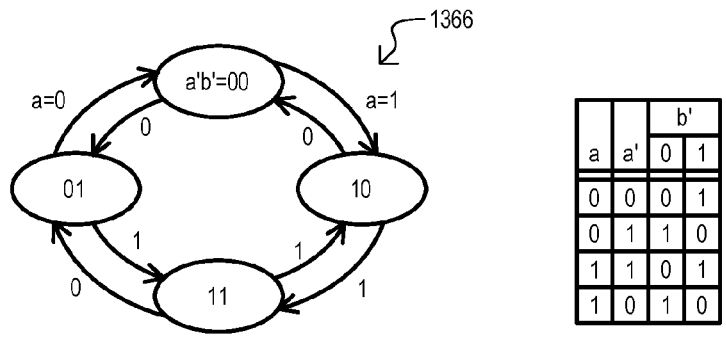
FIGS. 13A and 13B are a state diagram and Karnaugh map showing operations of an activity monitoring circuit that can be included in embodiments.

FIG. 13A is a state machine of a monitoring circuit like that of FIGS. 12A and 12C. FIG. 13B is a Karnaugh map for the state machine of FIG. 13A. Nodes a and a' represent a mission mode signal being monitored across a FF. Node b' can be the power fill activation signal (e.g., pf_act). For example, in FIG. 12C, FF 1232-2 can be included to represent scan chains that can be used during test that make the pf_act signal observable. As noted above, a pf_act signal can be controlled by both mission-mode accesses, and static test mode circuit access.

Figure 14A:
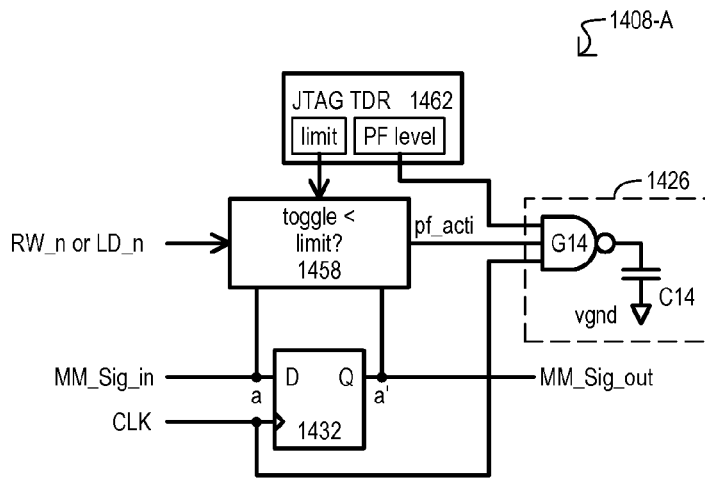
FIGS. 14A and 14B are diagrams showing an activity monitoring power fill circuits according to other embodiments.
Figure 14B:
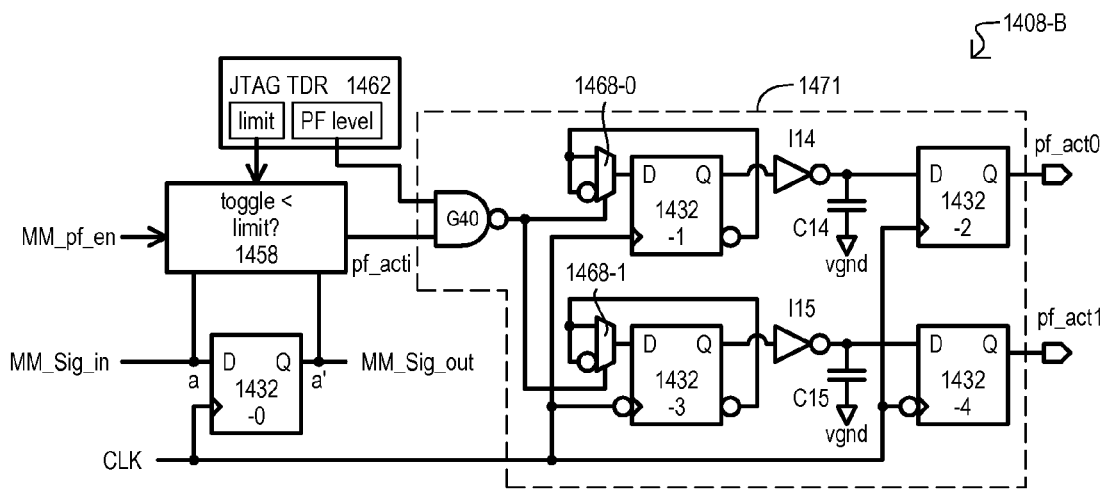

FIGS. 14A and 14B are block schematic diagrams of power fill circuits 1408-NB according to alternate embodiments. Referring to FIG. 14A, power fill circuit 1408-A can include items like those of FIG. 12A, however, activity detector 1458 can have a toggle limit. That is, activity detector 1458 can activate an initial power fill activation signal pf_acti after signals MM_Sig_in and MM_Sig_out have been the same for a certain amount of time (i.e., certain number of CLK cycles). Further, power dissipation block 1426 can be selectively enabled by a power fill level value (PF level). In the particular embodiment shown, toggle limit thresholds and PF level values can be provided by a test control circuit 1462. Further, in some embodiments, activity detector 1458 can further be controlled by input signals to the corresponding IC device. In one embodiment, an IC device can be a memory device, and input signals can be read/write (RW_n) and/or load signals (LD_n).

FIG. 14B shows a power fill circuit 1408-B that can include items like those of FIG. 14A, however, FIG. 14B further shows logic block 1471. Logic block 1417 can include a level disable gate G40, which can prevent the generation of two power fill activation signals (pf_act0, pf_act1) based on a power level value. An output from gate G40 can be applied to series connected FFs and related circuits, like those in the activity detector of FIG. 12C. However, one set of FFs 1432-0/1 can be clocked on one edge of clock CLK, while the other set of FFs 1432-2/3 can be clocked on the other edge of clock CLK. Thus, signal pf_act0 can vary in phase from signal pf_act1 by 180 degrees.

Figure 15:
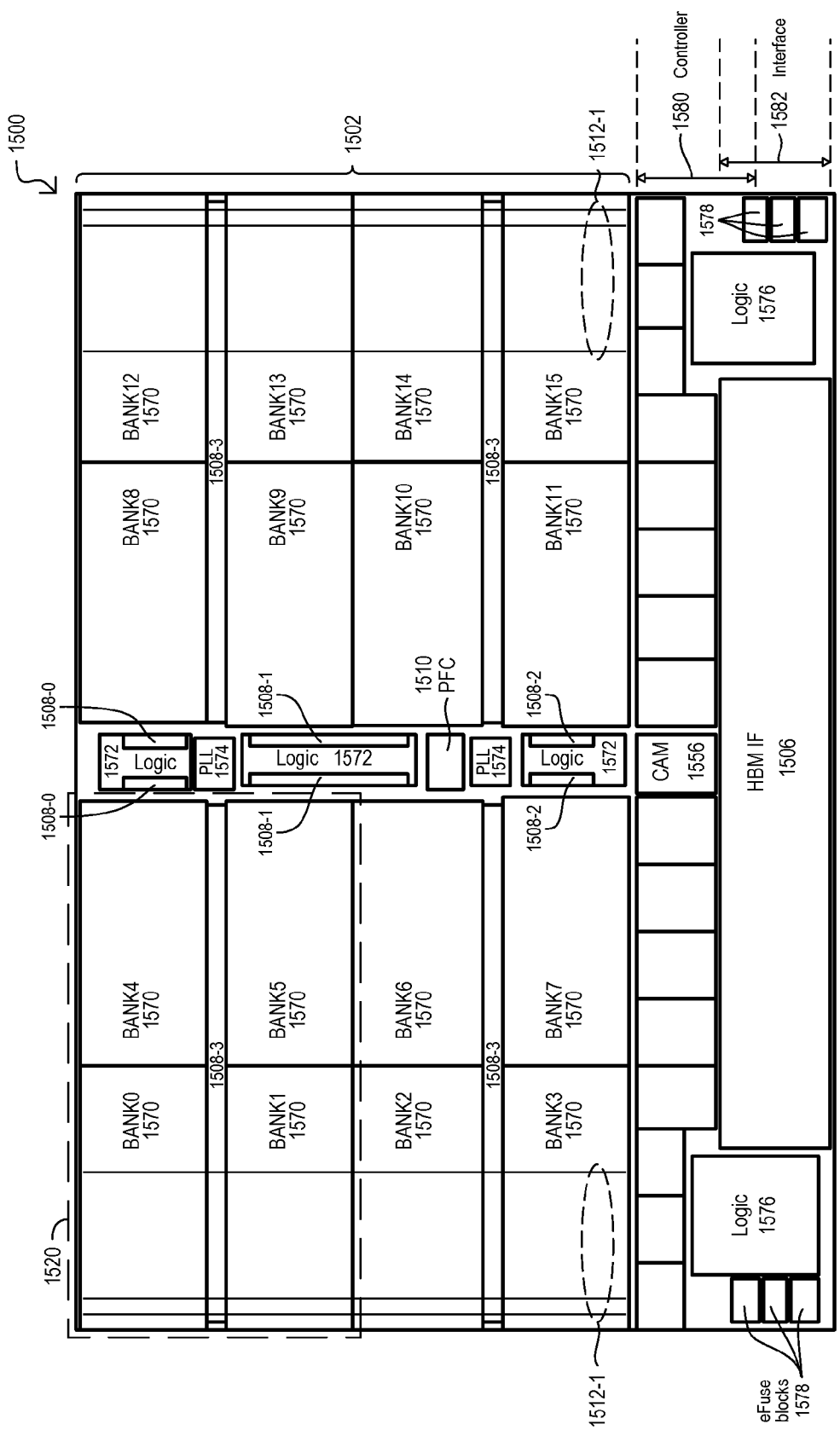
FIG. 15 is a block diagram of a memory device according to embodiments.

FIG. 15 shows an IC device 1500 according to another embodiment. IC device 1500 can be a memory device that includes a number of banks 1570, memory access logic 1572, PLLs 1574, a CAM section 1556, control logic 1576, configuration fuse circuits 1578, and an interface 1506. In addition, IC device 1500 can include power fill circuits 1508-0 to -3, as well as a PFC circuit 1510.

Banks 1570 can each include one or more memory cell arrays for storing data. In particular embodiments, memory cell arrays can be static random access memory (SRAM) cell arrays. In the embodiment shown, banks 1570 can be separated from one another by spaces in which other circuits are formed. A vertical "spine" region can include memory access logic 1572, PLLs 1574, PFC circuit 1510, and power fill circuits 1508-0 to -2. Horizontal separation regions (address spine) can include power fill circuits 1508-3 (as well as address circuits). Memory access logic 1572 can control access to banks 1570 in read and write operations.

PLLs 1574 can provide timing signals for IC device 1500, and in some embodiments can provide clock signals to branching clock trees which distribute such signals throughout the IC device.

PFC circuit 1510 can control power fill operations as described herein, or equivalents. Power fill circuits 1508-0 to -3 can provide power fill functions, and can take any of the forms described herein, or equivalents.

A CAM section 1556 can be used for write data caching. Configuration fuse circuits 1578 can provide non-volatile configuration data for IC device 1500 that can be accessed when the IC device powers up or is reset. Control logic 1576 can control operations within the IC device based on configuration data and input commands.

An interface 1506 can include I/Os for the IC device 1500. In some embodiments, an IC device 1500 can be a high data traffic device. In some embodiments, interface 1506 can include at least 128 data I/Os. In more particular embodiments, an interface 1506 can be a high bandwidth memory (HBM) interface that includes multiple independently operating channels, that each include their own control and address inputs, as well as 128 data I/Os.

In one embodiment, IC device 1500 can have a controller section 1580 that can switch any of multiple channels to any bank 1570, via switching circuits, such as a crossbar circuit, as but one example.

According to embodiments, an IC device 1500 can include any of: on-die decoupling capacitors, both inherent and explicit; minimized PG grid resistance; branched connections to clock tree buffer networks.

Referring still to FIG. 15, an IC device 1500 can include vertical metallization lines 1512-1 that are not used in mission mode operations. Such lines 1512-1 can be driven by power fill circuits as loads.

In addition or alternatively, IC device 1500 can include structural power fill at the sub-system or IP block level, that can include any of: toggling of targeted signals or circuits to mimic signal activity when there is no mission-mode signal throughput; one or more power fill enable control signals to activate/deactivate power fill functions; control of power fill levels through configuration data, such as that stored in a register. In particular embodiments, such power levels can be based on channels of the IC device. Further, an IC device 1500 can include a power fill balancing control mechanism that serves to balance the amount of power fill over different sections of the IC device (e.g., memory array and cross-bar).

In addition or alternatively, an IC device 1500 can include mechanisms that limit di/dt during mode transitions, like getting in and out of different modes, such as reset.

Referring still to FIG. 15, in some embodiments, in memory arrays (e.g., banks 1570) and a read cross-bar (cross-bar circuit for read data), there can be horizontal global data lines that are bank-related. Activity on these lines can happen as the banks are accessed and are independent of the number of channels enabled in interface 1506. A power fill level can take into account the number of enabled channels, while at the same time maintaining a low di/dt characteristic.

In a particular embodiment, an IC device 1500 can include any of: structural power fill that is independent of data flow (i.e., is not based on mission-mode signals); a PFC circuit 1510 that maintains a level of power fill to be a difference between the number of enabled channels and a number of accessed banks; and register control of the baseline amount of power fill to be used as a unit (e.g., 25%, 50%, 75%, 100%). Thus, for a memory array section (banks 1570), power fill exists as an independent power dissipation mechanism (i.e., independent of mission mode signals) as described herein.

In some embodiments, an IC device 1500 can include vertical WRITE data lines that are associated with banks 1570 instead of channels within interface 1506. In such an arrangement, independent power fill circuits can be activated as described herein in response to write operations.

In some embodiments, an IC device 1500 can include vertical READ global data lines that do correspond to channels within interface 1506. Mission mode based power fill circuits can be used to generate power fill activity on such lines in the absence of read data.

As noted herein, in some memory device embodiments, a power fill level can be controlled to complement memory access. In some arrangements, both the magnitude and locality of an access can be taken into account when generating the power fill activity. To account for magnitude, a type of access is accounted for. As but one example, the power associated with a READ access, $A_R$, can be considered a unit of power fill, $P_F$. A magnitude of PF can be controlled determined by a control register setting.

$$P_F(1)=P(A_R)$$

Furthermore, the power associated with a WRITE access can be equivalent to a fraction of the power related to a READ access (in this case ½) due to the fact that a READ access can involve a toggling the horizontal global data lines.

$$P(A_R)=2 \cdot P(A_W)$$

Using these values, in some embodiments, a total power fill level can be set to the power fill associated with READ accesses to the number of channels enabled, $N_{chEn}$, subtracted by the power fill associated with the real-time access level as expressed by $$P_{F,Total}=P_F(N_{ChEn})-P_F(N_{RA})-P_F(N_{WA}/2)-P_{F,OFFSET},$$

where $P_{F,OFFSET}$ can be greater than zero if power fill is unnecessary for cases where the number of enabled channels is low (i.e., $P_{F,OFFSET}=2$). A PFC circuit (e.g., 1510) can operate on four quadrants (one shown as 1520) of the memory array section, where ¼th of the power fill exists in each quadrant at all times. Each quadrant can have a minimum of $P_F/4$ and a maximum of $4P_F$.

Of course, this approach to addressing magnitude would vary accordingly for other devices having different power consumption per access type and/or a memory array section divided into more (or less) than four regions.

In some embodiments, to address locality, as the number of enabled channels increases, power fill circuits in different regions can be sequentially activated. In a very particular embodiment, an order of activation can be: power fill circuits located in a center spine area (i.e., 1508-0/1/2), followed by power fill circuits located in horizontal spine areas (i.e., 1508-3), followed by power fill circuits that drive vertical metallization lines 1512-1. Thus, when a low number of channels are enabled, for instance, more center spine and address spine located power fill circuits (i.e., 1508-0/1/2/3) are enabled than are power fill circuits that drive metallization lines 1512-1.

A controller section (e.g., 1580) can direct data traffic between memory banks 1570 and I/O channels of interface 1506. In some embodiments, this can include cross bar circuits. In some embodiments, most of the subcomponents of a controller section (e.g., 1580) can be channel-based, and can include a READ path, a read data input (DIN) cross-bar circuit, and a data bypass circuitry. Components in a controller section that can be are less related to channels can include a CAM (e.g., 1556) and a data cache. However in some embodiments, power fill circuits corresponding to a CAM and/or data cache can be controlled according to channel enable settings because a CAM can be centrally located and a data cache can have data written whenever write commands occur.

In some embodiments, power fill related to a controller section 1580 can vary according to the interaction between WRITE and READ commands. When overlap of cross-traffic occurs, power dissipation can be greater than if no power fill is activated. Accordingly, in some embodiments, a PFC circuit 1510 or some other circuit can detect the amount of WRITE and READ commands and can allow power fill operations to scale with cross-traffic. As but one example, when a WRITE occurs, for instance, some of the READ command (or shared) power fill can be de-activated.

Burning power during non-WRITE access can be undesirable. Accordingly, in some embodiments, as a user option, a channel enable can be used by a customer to remove WRITE mode power fill associated with a WRITE capable channel (i.e. don't use the WRITE-capable channels if you can help it).

Referring to FIG. 15, while embodiments can include any of the various power control features described, in one particular embodiment, the following power control features can be included in an IC device 1500: power fill operations can be scaled according to channel enable values; a register or other data storage structure can control power fill default level (i.e. 20%, 30%); when WRITEs are not occurring, I/O circuits can toggle DIN signals; and no READ path power fill is implemented.

In some embodiments, an interface (e.g., 1506) can include two different power supply domains. A first domain (VDD) can include logic circuits for controlling data paths. A second domain (VDDQ) can be used to drive output data signals. According to one embodiment, for circuits in the VDD domain, power fill circuits can operate based on channel enable settings. In some embodiments, such power fill circuits can take into account data bus inversion circuits which can invert output data values. For circuits in the VDDQ domain, power fill circuits can be included to reduce the amount of decoupling capacitance needed. In particular embodiments, power fill circuits can be aimed at reducing higher frequency current flow through device connections (e.g., pins), by selecting power fill switching speeds to have the appropriate frequency.

In some embodiments, power fill operations are enabled during a self-test mode. In a particular embodiment, an IC device 1500 can include a built-in self-test (BIST) circuit that can generate test addresses. Such a BIST circuit can provide test address (and control) information to a PFC circuit 1510, which can then activate suitable power fill circuits for the self-tests being executed. In some embodiments, a BIST circuit can be situated in the same vertical spine region as a PFC circuit 1510.

As noted above with reference to FIGS. 5A and 5B, in some embodiments power fill can track memory array access. An alternate embodiment of the IC device 1500 shown in FIG. 15 can include such features. Within banks 1570 and a cross bar within controller section 1580, READ cycle power fill can be implemented by toggling bank-related horizontal and vertical global data lines (GDLs).

An IC device 1500 can include vertical wires that are directly associated with channels, and their associated power fill can be enabled with the channel enable values, as described herein, or equivalents.

An IC device 1500 can further include horizontal global data line that are not related to channels. Power fill operations corresponding to these structure can thus be independent of the channel(s) being used. Further, power fill can be activated in or near the location of memory access.

According to such an embodiment, a default power fill can be applied to regions and to the IC device 1500 in general after initialization has completed. The locations of this initial power fill can be pre-determined and spread out over the memory array section. An amount of such an initial power fill can depend upon the number of channels enabled.

A default power fill configuration can take various forms. One particular arrangement for an IC device like that of FIG. 15 is shown in FIG. 16.

FIG. 16 is a table showing two example alternatives that can illustrate how power fill can be mapped to the number of channels enabled. In Alternative A, power fill can be enabled in targeted, single banks, where bank 8 is the first bank activated. In Alternative B, power fill for a small percentage of multiple banks can be activated, where groups of 4 banks are enabled at a time. PFC circuit 1510 can direct power fill from the trunk of the center spine to the banks 1570 and quadrants (e.g., 1520).

Once the IC device 1500 begins normal operations, power fill can then be activated in the quadrant (e.g., 1520) containing the memory array accessed. By doing this, the power fill is made to follow the data activity. When such an access occurs, unrelated default power fill can be disabled in steps to allow the activity-based power-fill to take over.

Once an access completes, the "tracking" power fill can produce an "after glow" in the previously accessed region and can either remain there or be slowly transitioned over to the default map. As new areas are accessed, power fill in previously accessed areas can be stepped down.

Referring still to FIG. 15, an IC device 1500 can include a bank level interface for power fill operations. A bank (e.g., 1570) can include power fill circuits corresponding to horizontal and vertical global data lines (GDLs) in the bank. For both such power fill circuits, a bank can receive power fill level control signals, which can control an amount of power fill. In a particular embodiments, each bank (e.g., 1570) can receive four control signals, pf_level[3:0]. Each signal controls ¼th the total effective power fill level of the bank. In this way, a bank can be activated with 0%, 25%, 50%, 75% or 100% of the maximum possible power fill available. Separate control signals can be used for activating the different power fill circuits. In a particular embodiment, for power fill corresponding to horizontal GDLs, a bank related control signal, pf_h_en, can be used. For power fill corresponding to vertical GDLs, a bank related control signal, pf_v_en, can be used.

In an alternate embodiment, an IC device 1500 can include an operation-mode activity monitor that can control power fill according to a level of activity detected. In an embodiment, an IC device 1500 can include a channel activity monitor (e.g., in interface 1506) that can receive channel command signals to determine channel activity. A power fill control state machine (e.g., within PFC circuit 1510) can receive such channel activity monitor data, and controls the amount of power fill in the IC device 1500. Changes in power fill levels can be limited to small steps that keep di/dt below predetermined limits.

During normal operation, when a device is not in a reset or low power state, a power management block (e.g., within PFC circuit 1510) can enter a control state that responds to two sets of inputs: channel enable data and activity monitor data. In such an embodiment, a power management block can have power fill MAX and MIN values defined for various regions. These values can be used to manipulate power fill levels.

In a particular embodiment, an IC device 1500 can be a QDR wide I/O SRAM device. In such an embodiment, data pattern dependence power fill, such as that shown in FIGS. 10-14B can be employed.

In such an embodiment, within a memory section 1502, a read data path may not include power fill, and can instead have "return-to-common" signaling. In contrast, within a write data path, activity monitor power fill circuits can be located where WRITE pipeline stages are placed, which in some embodiments, can be within the address spines (i.e., location of 1508-3). During a WRITE operation, data can be sent to the associated memory bank (e.g., 1570). Because of this, the power fill located in the address/decoder spines may be sufficient to compensate for the lack of data dependent power fill in other areas of the die (like the memory controller area).

In such an embodiment, within an interface 1506, output connections (e.g., pins) being driven from an I/O power supply level (e.g., VDDQ) can represent the largest amount of power dissipated in the block. Thus, activity dependent power fill can be included to guard against lower frequency PDN characteristics. With respect to write data paths in the interface 1506, activity monitoring power fill circuits can be included at write data (DIN) driver locations, where an equivalent amount of power can be dissipated to that of the DIN data path.

Optionally, within interface 1506 activity monitoring power fill circuits can be used in address bus path. Similarly, such circuits can be included in an address bus of CAM 1556. This can mitigate power variation dependence on such address buses.

With regard to read operations, such an embodiment can further include power fill circuits as shown in FIG. 11C (read data paths for both cached an uncached data).

With regard to write operations, such an embodiment can control switching of the DIN wires within interface 1506 as noted above. In addition, power fill circuits in the address/decoder spine areas can be activated as also noted above. Optionally, such an embodiment can further include activity monitoring power fill circuits at the input of data cache circuitry.

In such an embodiment, a worst-case change in current for the QDR wide I/O SRAM device can be reduced to levels much below the worst case for a conventional device noted above (i.e., using 4 cycles as the ramp time, a maximum di/dt ramp time of roughly 1.2 to 1.3 A/ns). The trade-off can be the level of power dissipation in the embodiment employing power fill, which can have a higher minimum than that of the conventional device.

In some embodiments, an IC device 1500 can include a PFC circuit 1510 that maintains a map of power fill over the memory array section 1502 according to quadrants (e.g., 1520) and banks (1570). Inputs to such a PFC circuit 1510 can include a number of channels enabled cs_chen[4:0] and read command signals. Outputs from the PFC circuit 1510 can include the amount of power fill needed for each bank. In one embodiment, this can be maintained by a four bit enable bus cs_pfen[3:0] that can indicate a number banks with power fill activated at any time. A number of channels enabled can determine a total number of banks having power fill activated. A PFC circuit 1510 can maintain a state of each bank access, where each bank is assigned a power fill state: on, stale, off. A bank location can become stale when access stops.

Figures 17A, 17B:
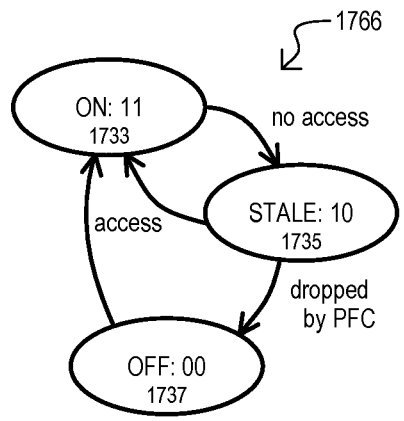
FIGS. 17A and 17B are a state diagram and table showing the monitoring of bank statuses for application of power fill operations, according to embodiments.

When a bank (e.g., 1570) is accessed, a PFC circuit 1510 can upgrade its state accordingly as shown in FIG. 17A. At the same time, PFC circuit 1510 can downgrade another bank with a pre-existing stale state. Such a downgrading operation is shown in the table of FIG. 17B.

Referring to FIG. 17A, a state machine 1766 shows how a bank status can change according to device operations. If a bank is accessed (access) its status can be ON 1733. If there is no access (no access) a bank's status can be downgraded to STALE 1735. If a stale bank is accessed, it can return an ON status 1733. Conversely, a stale bank can eventually be dropped by a PFC controller to the OFF status 1737 if it is not accessed. In one embodiment, a bank with the oldest stale state can be dropped to have its power fill shut off.

Referring to FIG. 17B, in the example shown, bank 12, which was OFF, is accessed, and so transitions from an OFF state to an ON state. At the same time, bank 5, which was ON, is not accessed and so transitions to a STALE state. Lastly, because bank 5 transitions to a STALE state, a PFC circuit transition previous stale bank 10 to the OFF state (e.g., bank 10 could the oldest stale bank at the time).

It is understood that when such bank state transitions occur, a PFC circuit 1510 perform both upgrade and downgrade actions at the same time. Further, corresponding power fill operations can gradually grow and shrink or swap immediately.

Figure 18:
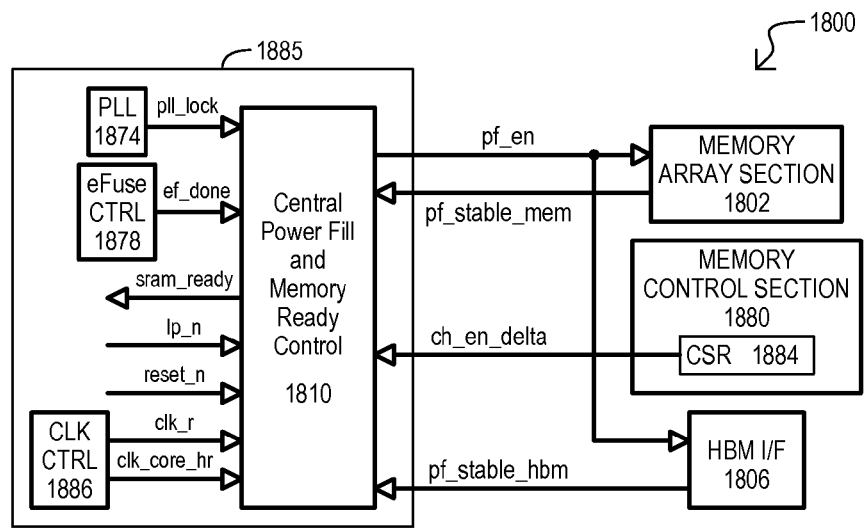
FIG. 18 is a block diagram of a memory device according to another embodiment.

FIG. 18 is a block diagram of a memory device 1800 according to another embodiment. Memory device 1800 can include a memory array section 1802, a memory control section 1880, an interface 1806, and a logic section 1885. A memory array section 1802 can include memory arrays as described for other embodiments herein, or equivalents. An interface 1806 can include a number of independent channels, each having their own address, control and data connections. Channels can access memory arrays of memory array section 1802 in read and write operations. A memory control section 1880 can include a channel status register 1884 that can provide channel status information.

Logic section 1885 can include a central power fill and memory ready control (PFMC) circuit 1810, a PLL 1874, configuration fuse control circuit 1878, and a clock control circuit 1886. PFMC circuit 1810 can receive mode signals lp_n and reset_n which can indicate modes of operation for the memory device 1800. For example, lp_n can indicate a low power mode, while reset_n can indicate a reset operation. PLL 1874 can provide a signal pll_lock to PFMC circuit 1810, which can indicate when a PLL 1874 has reached a stable state. Fuse control circuit 1878 can provide a signal of done to PFMC circuit 1810 that can indicate when configuration values have been read from a nonvolatile store (i.e., efuse). Clock control circuit 1886 can provide two clock signals clk_r and clk_core_hr.

Memory array section 1802 can provide a signal pf_stable_mem to PFMC circuit 1810, which can indicate when power fill circuits are stable in the memory array section 1802. Channel status register 1884 can provide a signal ch_en_delta to PFMC circuit 1810 which can indicate when there is an increase or decrease in the number of channels active. Interface 1806 can provide a signal pf_stable_hbm to PFMC circuit 1810, which can indicate when power fill circuits are stable in the interface 1806.

Figure 19:
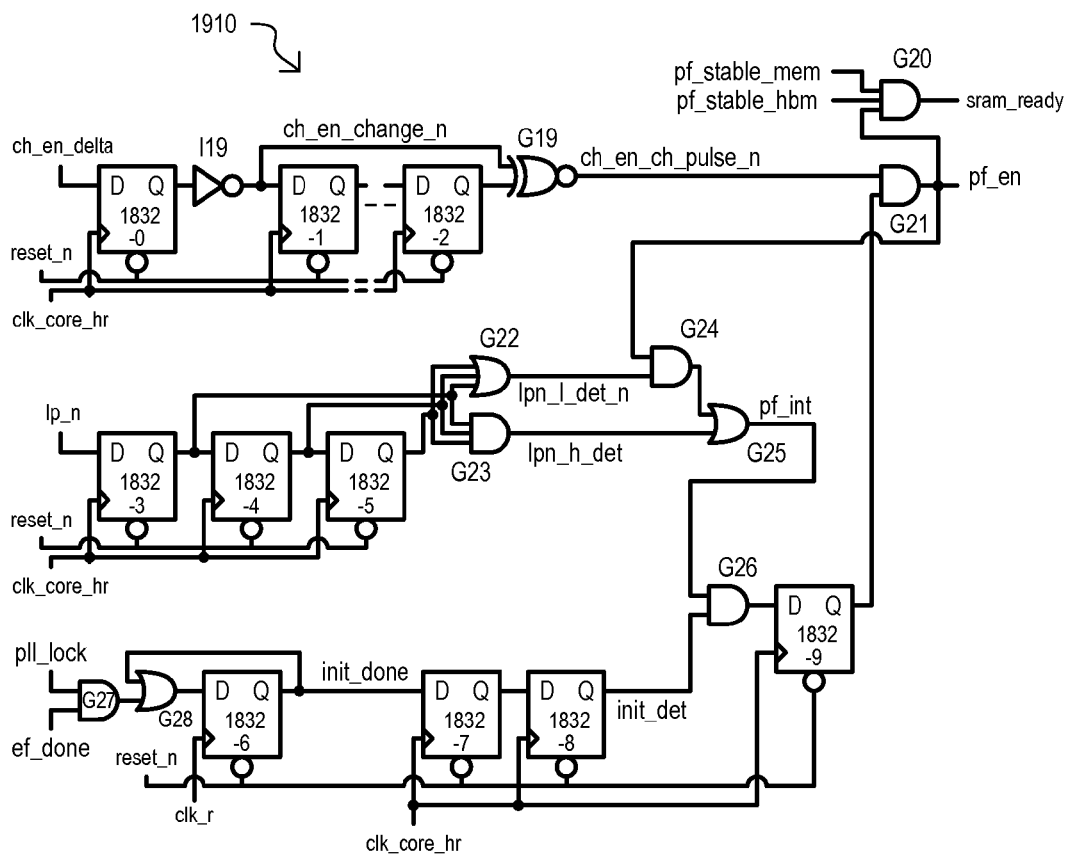
FIG. 19 is a block schematic diagram of a power fill and memory ready control circuit according to an embodiment.

In response to the various input signals, PFMC circuit 1810 can provide a power fill enable signal, which can enable/disable power fill circuits within memory array section 1802 and interface 1806. In addition, PFMC circuit 1810 can provide an sram_ready signal, which can indicate when the memory is ready for mission mode type operations. FIG. 19 is a schematic diagram of a PFMC circuit 1910 that can be included in embodiments.

Figure 20:
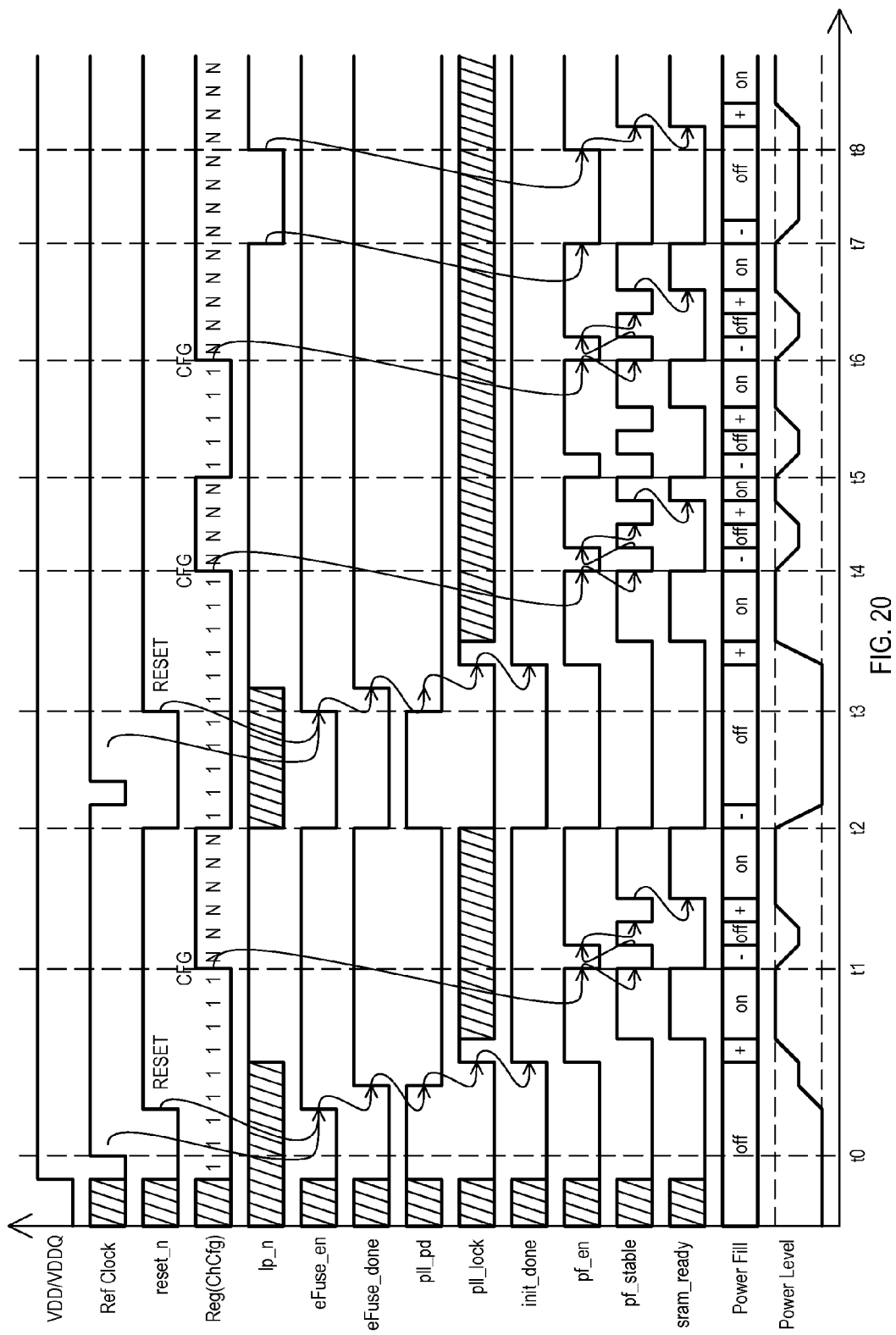
FIG. 20 is a timing diagram showing power fill operations for an embodiment like that of FIG. 18 or 19.

FIG. 20 is a timing diagram showing the operation of a memory device like that of FIG. 18. Referring to FIG. 20, at device reset, pf_en and pf_stable can be LOW. When pf_en is set to HIGH (via the circuit function shown in Error! Reference source not found., the various sections can ramp up power fill circuits gradually to their respective targets as can determined by their local control (e.g., JTAG TDR circuit). When completed, the pf_stable signals (i.e., pf_stable_mem, pf_stable_hbm) can be set HIGH allowing sram_ready to indicate that the device is ready for normal operation. This is shown between times t0 and t1.

Referring still to FIG. 20, when power fill is de-activated by setting lp_n to LOW, pf_en is driven LOW, pf_stable is set LOW and the device sections reduce power fill levels gradually to zero. When the subsystem power level changes are completed, pf_stable is set to HIGH again and pf_en remains LOW until lp_n is set HIGH again. This is shown between times t7 and t8.

Referring still to FIG. 20, when power fill is de-activated by a channel enable configuration change, a same power fill reduction process is followed as in the low lp_n case. Once all pf_stable signals are set HIGH (marking the completion of the process), the PFMC 1810 can enables the power fill again by setting pf_en to HIGH. This can trigger a LOW on pf_stable and the ramp up of power fill levels within the device sections until the target power fill level is reached. The device sections can comprehend the new channel enable settings only after pf_stable is set LOW. This is shown between times t2 and t4.

Figure 21:
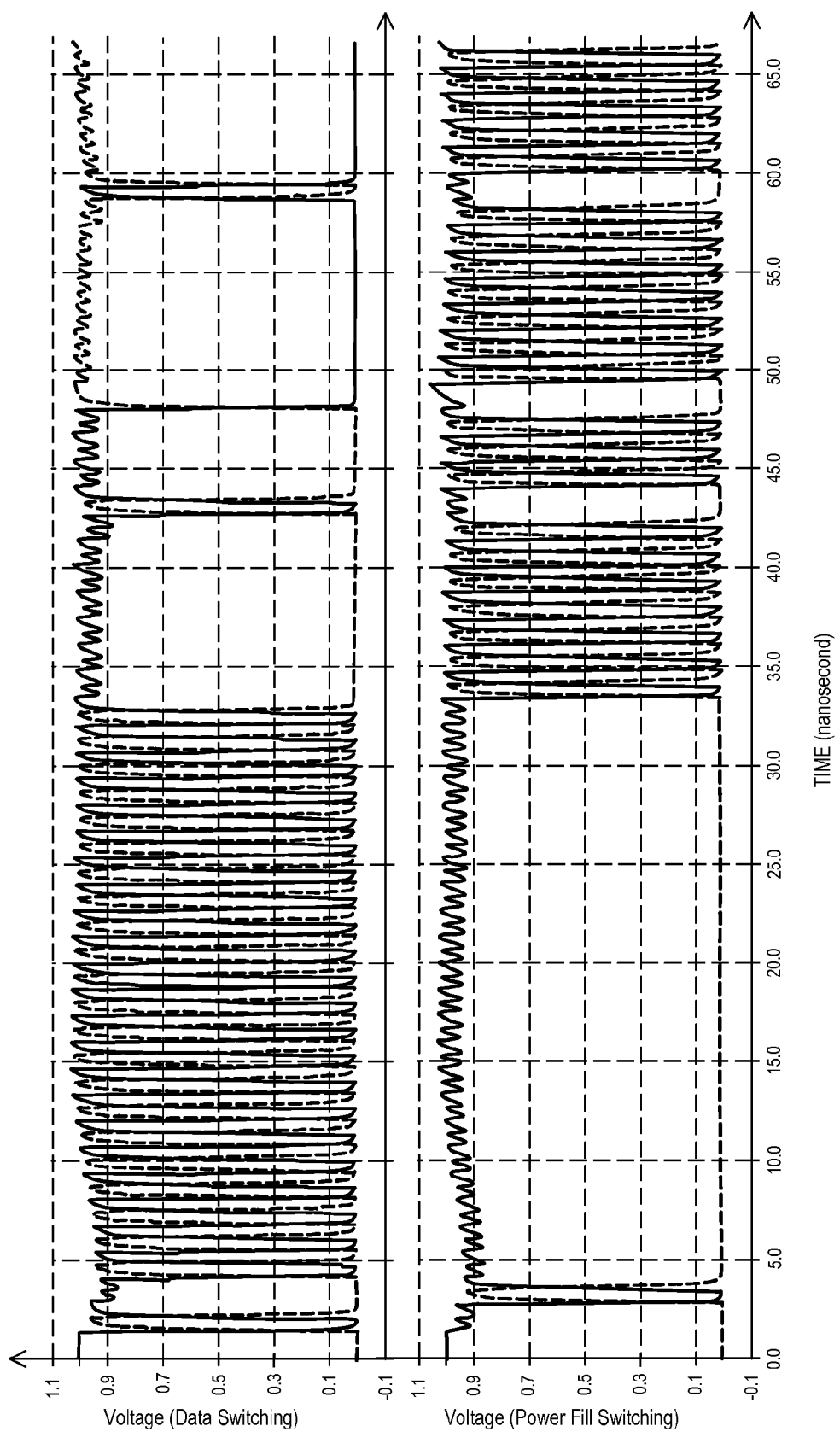
FIGS. 21 to 23 are simulation results for a static random access memory (SRAM) device with and without power fill operations according to embodiments.

FIG. 21 are simulation results showing signal switching in an SRAM device having power fill circuits that follow circuit activity according to an embodiment. In the first pane, data is completely toggling (100%) for the first half of the simulation and rarely toggles in the second half. The second pane illustrates a power fill pattern applied to out of band or "in-line" power fill circuits. As shown, power fill can be active only when the data is not.

Figure 22:
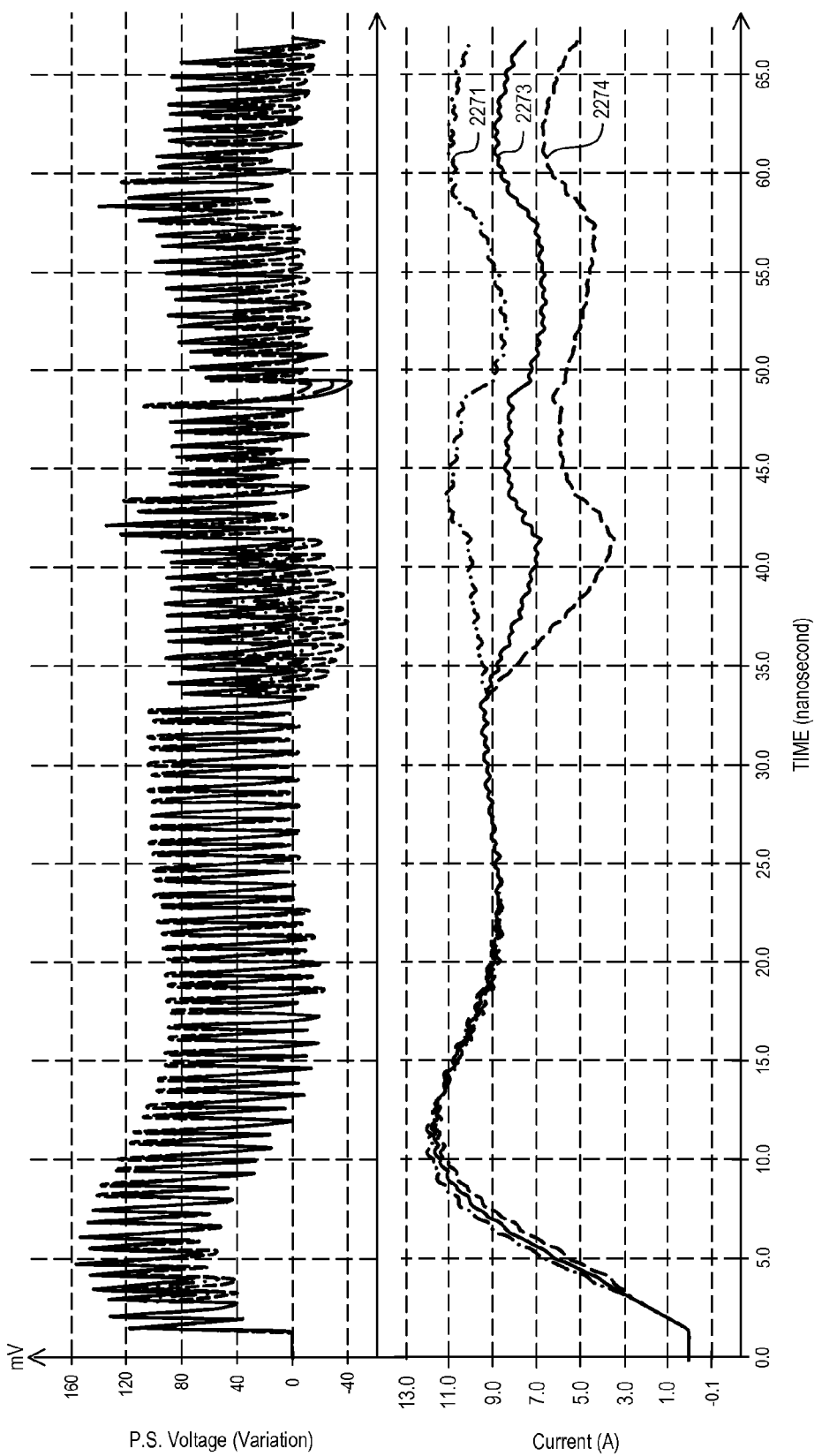

FIG. 22 shows simulation results for power supply voltage levels and current draw levels through power supply pins for an SRAM device having power fill circuits enabled according to embodiments, as well as when such power fill circuits are disabled. The time axis of FIG. 22 corresponds to that of FIG. 21.

FIG. 22 shows three different scenarios. Waveform 2271 shows an SRAM device according to an embodiment, with a power fill level that is equivalent to data power dissipation. Waveform 2273 shows an SRAM device according to an embodiment, with a power fill level that is slightly less than data power dissipation. Waveform 2274 shows the SRAM device when the power fill is turned off (equivalent to a conventional case).

Figure 23:
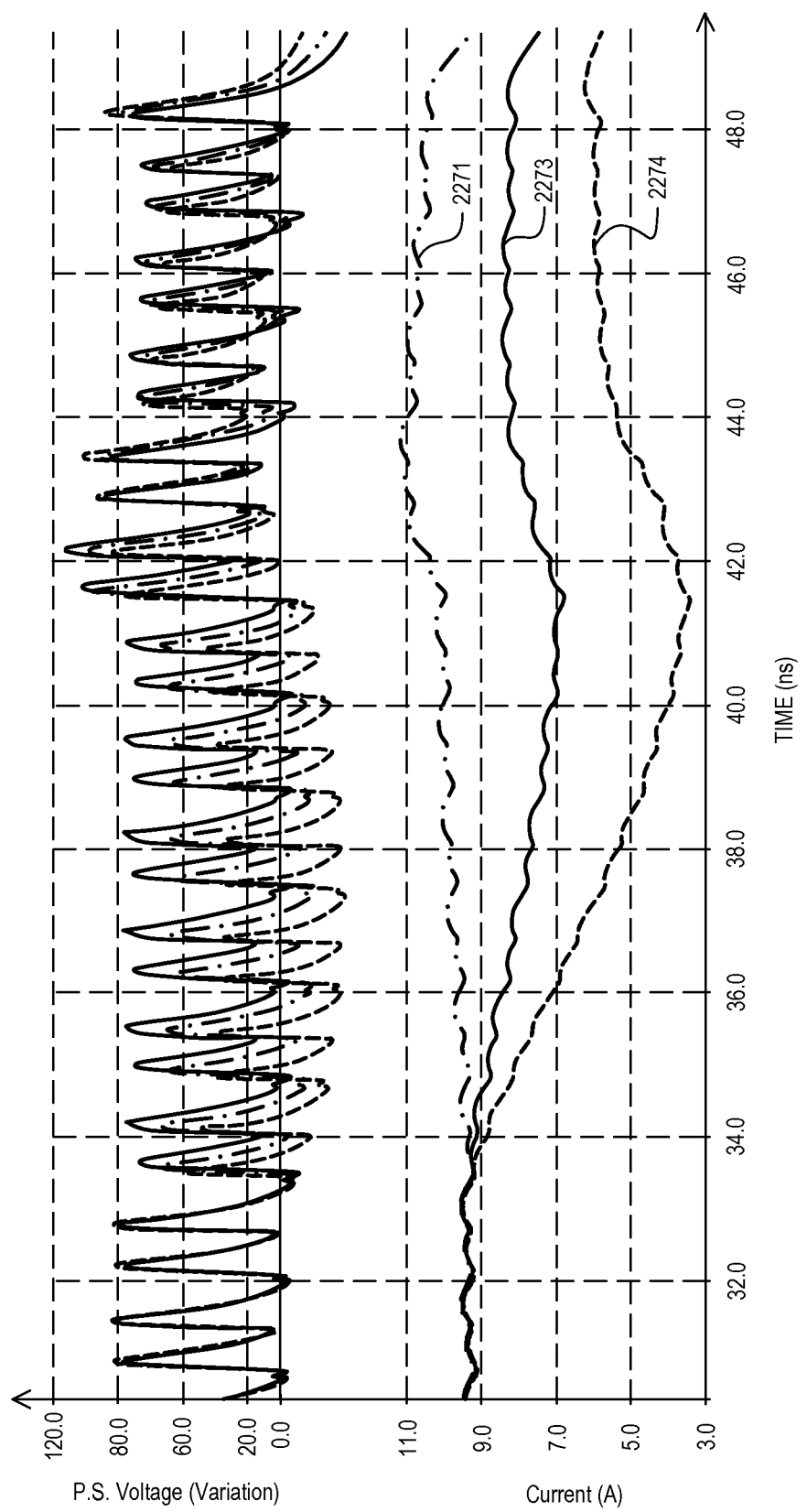

FIG. 23 is a zoomed in view of FIG. 22.

It is noted that di/dt results when the data pattern stops toggling. Further, the circuit power supply voltage waveform 2274 (power fill off) dips the most. In contrast, waveform 2271 (highest amount of power fill) dips the least.

It should be appreciated that references throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit (IC) device, comprising:
   a memory array section comprising a plurality of memory arrays that each include memory cells for storing data values;
   a data path section having switching circuits configured to enable data paths between the memory arrays and a plurality of input/outputs (I/Os) of the IC device;
   a power fill control circuit configured to activate power-fill circuits in the IC device to perform non-mission mode operations that consume current, the amount of non-mission mode operations varying in response to mission mode circuit activity in the IC device; and
   at least one power-fill configuration register;
   wherein the amount of non-mission mode operations is configurable according to a data value stored in the power-fill configuration register; and
   wherein mission mode circuit activity includes circuit activity resulting from a user input to the IC device.

2. The IC device of claim 1, wherein:
   the power-fill circuits include circuits that execute mission mode circuit activity in one mode and the non-mission mode operations in a power fill mode.

3. The IC device of claim 1, wherein:
the power-fill circuits are dedicated power fill circuits that do not execute mission mode circuit activity.

4. The IC device of claim 1, further including:
the memory arrays are organized into a plurality of banks;
an interface circuit that includes connections for a plurality of channels, each channel including its own address connections and data connections, and being enabled in order to read or write data through the channel; and
the data path section is operable to connect any bank to any channel;
wherein the power consumed by non-mission mode operations is proportional to a difference between the number of channels enabled and the number of banks being accessed by the enabled channels.

5. The IC device of claim 1, wherein:
at least some of the power-fill circuits each comprise:
    a signal monitoring circuit coupled to a signal path that carries a signal resulting from a function provided by the IC device;
    a power-fill driver that drives a power-fill load according to the logic state of the signal.

6. The IC device of claim 5, wherein:
the signal is generated from values selected from the group of: address values, control values, write data values, and read data values.

7. An integrated circuit (IC) device configured to perform functions in response to user inputs, comprising:
a memory array section comprising a plurality of memory arrays that each include memory cells for storing data values;
a data path section having switching circuits configured to enable data paths between the memory arrays and a plurality of input/outputs (I/Os) of the IC device; and
a plurality of power fill circuits, each configured to perform non-mission mode operations that consume current, the non-mission mode operations increasing as circuit activity from performing mission mode operations decreases;
wherein mission mode operations include circuit activity resulting from a user input to the IC device.

8. The IC device of claim 7, further including:
a power fill control circuit configured to selectively enable or disable at least some of the power fill circuits.

9. The IC device of claim 8, wherein:
the power fill control circuit is further configured to:
    selectively enable increasing numbers of power fill circuits as the circuit activity from performing the mission mode operations decreases; and
    selectively disable increasing numbers of power fill circuits as the circuit activity from performing the mission mode operations increases.

10. The IC device of claim 8, wherein:
the power fill control circuit is further configured to:
    selectively enable increasing numbers of power fill circuits as the IC device transitions from a lower power mode to an operating mode; and
    selectively disable increasing numbers of power fill circuits as the IC device transitions from an operating mode to a lower power mode.

11. The IC device of claim 8, further including:
the memory arrays are organized into a plurality of banks;
an interface circuit that includes connections for a plurality of channels, each channel including its own address connections and data connections, and being enabled in order to read or write data through the channel; and
the data path section is operable to connect any bank to any channel;
wherein the power consumed by non-mission mode operations is proportional to a difference between the number of channels enabled and the number of banks being accessed by the enabled channels.

12. The IC device of claim 7, wherein:
the memory arrays are physically separated from one another by spine regions; and
at least some of the power fill circuits are disposed in the spine region.

13. The IC device of claim 7, wherein:
the memory array includes data paths that have a capacitive-resistive load, and
at least some of the power fill circuits drive power fill loads that match those of the data paths.

14. A method, comprising:
accessing a memory array section of an IC device to read and write data values therein;
enabling data paths between memory arrays of the memory array section and a plurality of input/outputs (I/Os) of the IC device with switch circuits to provide read and write data paths; and
activating power fill circuits, in the memory array section, that execute non-mission mode operations to increase current consumption as current consumption from mission mode operations of the IC device decreases;
wherein the mission mode operations include circuit activity resulting from a user input to the IC device.

15. The method of claim 14, further including:
deactivating the power fill circuits to reduce current consumption as current consumption from the mission mode operations increases.

16. The method of claim 14, wherein:
activating the power fill circuits includes activating circuits that execute the mission mode operations in one mode and the non-mission mode operations in a power fill mode.

17. The method of claim 14, wherein:
activating the power fill circuits includes activating circuits dedicated to the non-mission mode operations.

18. The method of claim 14, wherein:
activating the power fill circuits includes:
    monitoring signal paths in the IC device for signal activity and
    activating at least a portion of the power fill circuits when there are no transitions on the signal paths, and de-activating the portion of power-fill circuits when there are transitions on the signal paths.

19. The method of claim 14, wherein:
activating the power fill circuits includes controlling the amount of power fill circuit current consumption in response to a configuration value stored by the IC device.

20. The method of claim 14, wherein the IC device comprises a power-fill configuration register, and the method further comprises configuring the amount of non-mission mode operations according to a data value stored in the power-fill configuration register.

* * * * *